United States Patent
Dimitriu

(10) Patent No.: US 11,626,886 B2
(45) Date of Patent: Apr. 11, 2023

(54) THERMOMETER CODING FOR DRIVING NON-BINARY SIGNALS

(71) Applicant: Micron Technology, Inc., Boise, ID (US)

(72) Inventor: Dragos Dimitriu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/382,185

(22) Filed: Jul. 21, 2021

(65) Prior Publication Data
US 2023/0025764 A1    Jan. 26, 2023

(51) Int. Cl.
H03M 7/16    (2006.01)
H03M 3/00    (2006.01)
H03M 1/06    (2006.01)

(52) U.S. Cl.
CPC ......... H03M 7/165 (2013.01); H03M 1/0648 (2013.01); H03M 3/424 (2013.01)

(58) Field of Classification Search
CPC ..... H03M 7/165; H03M 1/0648; H03M 3/424
See application file for complete search history.

(56) References Cited

U.S. PATENT DOCUMENTS

| | | | | |
|---|---|---|---|---|
| 6,653,961 B1 * | 11/2003 | Gosser | ............... | H03M 1/0614 |
| | | | | 341/135 |
| 7,746,260 B1 * | 6/2010 | Tu | ............... | H03M 1/66 |
| | | | | 327/91 |
| 7,889,106 B2 * | 2/2011 | Imai | ............... | G05F 3/262 |
| | | | | 341/144 |
| 7,944,382 B2 * | 5/2011 | Mateman | ............... | H03M 1/664 |
| | | | | 341/139 |
| 8,390,491 B2 * | 3/2013 | Wakimoto | ............... | H03F 1/301 |
| | | | | 327/542 |
| 10,020,817 B1 * | 7/2018 | Zhang | ............... | H03M 1/066 |
| 10,305,505 B1 * | 5/2019 | Zhang | ............... | H03M 1/68 |
| 10,326,469 B1 * | 6/2019 | Cope | ............... | H03M 1/68 |
| 2007/0126467 A1 | 6/2007 | Kim | | |
| 2010/0238722 A1 | 9/2010 | Hashimoto et al. | | |
| 2011/0037496 A1 | 2/2011 | Ibaraki et al. | | |
| 2018/0123593 A1 | 5/2018 | Choi | | |
| 2019/0103149 A1 | 4/2019 | Hasbun et al. | | |

FOREIGN PATENT DOCUMENTS

JP    2011-040983 A    2/2011
KR    10-2007-0036473 A    4/2007

OTHER PUBLICATIONS

"International Search Report and Written Opinion of the International Searching Authority," issued in connection with Int'l Appl. No. PCT/US2022/073719 dated Oct. 27, 2022 (11 pages).

* cited by examiner

*Primary Examiner* — Lam T Mai
(74) *Attorney, Agent, or Firm* — Holland & Hart LLP

(57) ABSTRACT

Methods, systems, and devices for thermometer coding for driving non-binary signals are described. A set of drivers may be used to drive a signal line, with each of the drivers calibrated to have different individual drive strengths. To drive a signal line to successive voltages in accordance with a non-binary modulation scheme, additional individual drivers of the set may be used. The different drive strengths of the individual drivers of the set may scale in non-linear fashion, which may offset non-linearities associated with the individual drivers as additional individual drivers of the set are activated.

20 Claims, 8 Drawing Sheets

THERMOMETER CODING FOR DRIVING NON-BINARY SIGNALS

FIELD OF TECHNOLOGY

The following relates generally to one or more systems for memory and more specifically to thermometer coding for driving non-binary signals.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
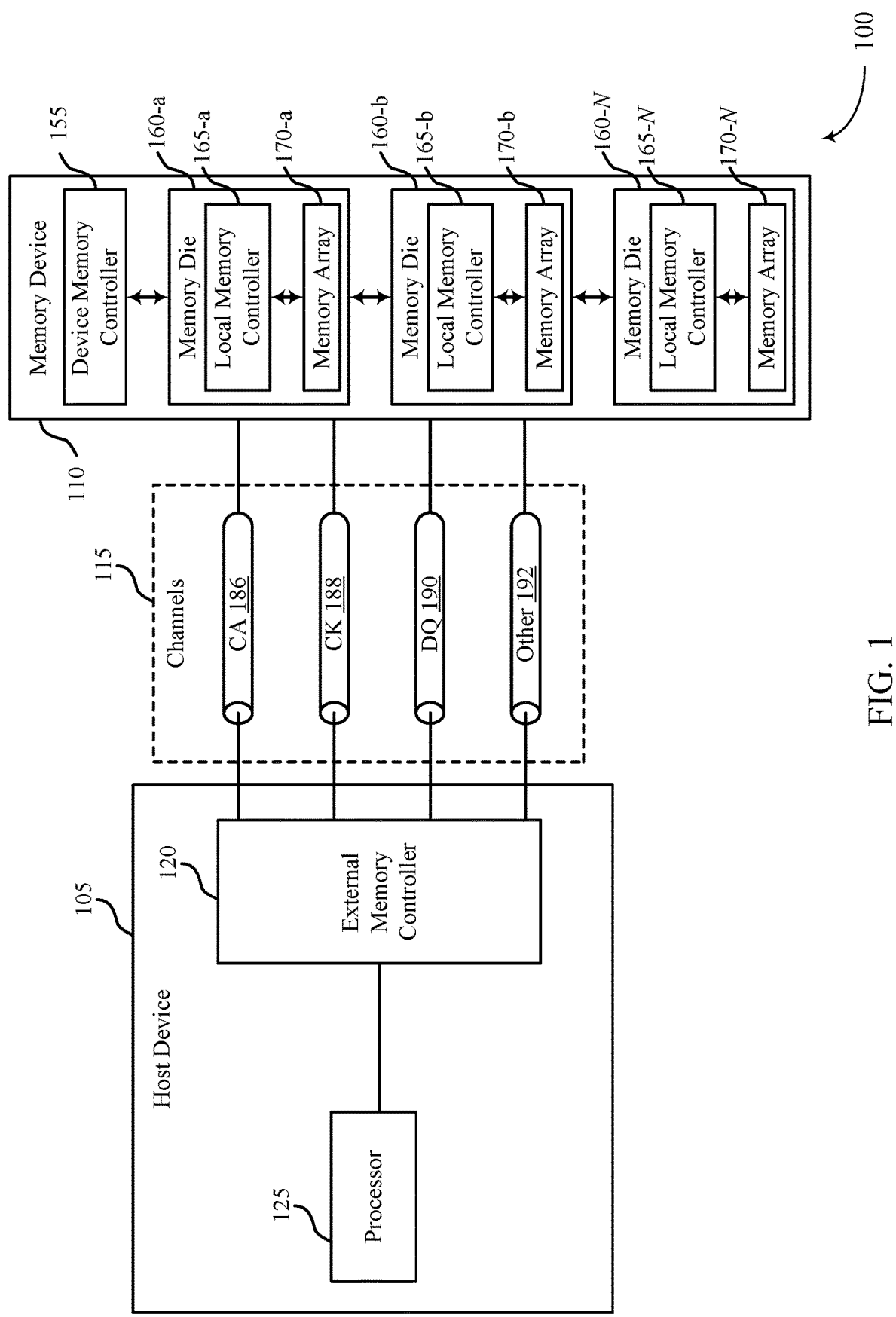
FIG. 1 illustrates an example of a system that supports thermometer coding for driving non-binary signals in accordance with examples as disclosed herein.

A memory device may be used to store data for a host device in an electronic system. In some examples, the memory device may exchange (e.g., transmit or receive) signaling with the host device (e.g., signaling representative of data to be written to the memory device or data read from the memory device). To generate the signaling, the memory device may include drivers to drive signal lines to different voltages (e.g., target voltages), where a voltage on a signal line may represent one or more bits of information. For example, four target voltages may be used, each of which may represent two bits of information (e.g., a first voltage on a signal line may represent two bits corresponding to a logic value of 00, a second voltage on the signal line may represent two bits corresponding to a logic value of 01, a third voltage on the signal line may represent two bits corresponding to a logic value of 10, and a fourth voltage on the signal line may represent two bits corresponding to a logic value of 11. A receiver may identify the voltage on the signal line (e.g., may identify that the voltage of the signal line is within a voltage range) and thus identify the one or more bits of information represented by the voltage (e.g., may identify two bits corresponding to a logic value of 00 if the voltage of the signal line is within a first voltage range that includes the first voltage, may identify two bits corresponding to a logic value of 01 if the voltage of the signal line is within a second voltage range that includes the second voltage, and so on).

A driver for a signal line may include one or more pull-down drivers and one or more pull-up drivers. (As used herein, a driver may refer to a set of pull-up drivers, a set of pull-down drivers, or any combination thereof that may be used to drive a signal line to various voltages.) To drive the signal line to a target voltage, one or more pull-down drivers within the driver, one or more pull-down drivers within the driver, or any combination thereof may be activated, while one or more other pull-down drivers or pull-up drivers are deactivated.

In some examples, a driver (e.g., a pull-up or pull-down driver) may be calibrated at a first voltage but may also be used (e.g., in combination with one or more other pull-up or pull-down drivers) to drive a signal line to one or more other voltages. In such examples, when the driver is also used to drive the signal line to one of the other voltages, the driver may have a different impedance than the calibrated impedance it has at the first voltage. As used herein, an impedance of a driver may reference to an output impedance of the driver when the driver is activated (e.g., used to drive a signal line). For example, a pull-up driver calibrated at a first voltage may have a first impedance when used to drive the signal line to the first voltage, but the same pull-up driver may have a second impedance when used to drive the signal line to the second voltage. Such behavior may relate to a non-linearity of the driver (e.g., an output impedance of the driver may vary in non-linear fashion as a function of the driver's output voltage). In some examples, variations in the impedance of a driver when operated at different voltages may cause the margins between the different voltages associated with a signaling scheme, which may alternative be referred to as a modulation scheme (e.g., a pulse amplitude modulation (PAM) scheme), to vary from one voltage to another. For example, in a signaling scheme in which four voltages are used, a difference between the first voltage and the second voltage may be different than a difference between the second voltage and the third voltage, which may in turn be different than a difference between the third voltage and the fourth voltage. Such variances may impact the ability of a receiving device to correctly decode signaling generated by the driver. For example, the margin (e.g., window, difference) between some adjacent voltages within the modulation scheme may be undesirably narrow due to the non-linearity of one or more drivers.

As described herein, a driver may operate based on thermometer coding principles. For example, a driver for a signal line may include a set of pull-up drivers and a set of pull-down drivers. In order to drive the signal line to different successive voltages (e.g., v0, v1, v2, v3, which may be different target voltages in increasing order), an additional pull-up driver of the set may be activated at each of the different successive voltages. Correspondingly, an additional pull-down driver of the set may be deactivated at each of the different successive voltages. For example, zero pull-up drivers and three pull-down drivers may be used to drive the signal to v0; one pull-up driver and two pull-down drivers may be used to drive the signal line to v1; two pull-drivers and one pull-down driver may be used to drive the signal line to v2; and three pull-up drivers and zero pull-down drivers may be used to drive the signal line to v3. As more pull-up drivers are used (e.g., activated), the overall drive strength (in the pull-up direction) of the driver may increase, and thus the overall output impedance (in the pull-up direction) of the driver may decrease. Correspondingly, as more pull-up drivers are used, fewer pull-down drivers may be used, and the overall drive strength of the driver in the pull-down direction may decrease, and thus the overall output impedance of the driver in the pull-down direction may increase. The different target voltages may scale linearly (e.g., 0V, 0.167V, 0.333V, 0.5V). The individual drivers (e.g., pull-up drivers, pull-down drivers, or both) may, however, have different respective strengths (and hence, different output impedances) such that the overall drive strength of the driver (e.g., in the pull-up direction, the pull-down direction, or both) may scale non-linearly, which may counteract (e.g., compensate for) the non-linearity of the individual as additional drivers are activated or deactivated.

For example, if a first pull-up driver is used without any other first pull-up drivers to drive the signal line to v1, the first pull-up driver maybe calibrated to have a desired first drive strength at v1. When the first pull-up driver is used at v2 (e.g., in conjunction with a second pull-up driver), the non-linearity of the first pull-up driver may result in the first pull-up driver having a higher, second drive strength at v2 (e.g., a lower output impedance at v2 than v1). Thus, the second pull-up driver may be calibrated to have a third drive strength at v2, where the third drive strength may differ from the first drive strength in manner that compensates for (e.g. offsets) the change in drive strength exhibited by the first pull-driver as between v1 and v2. Thus, the individual drive strengths may vary from one pull-up driver to the next in non-linear fashion, which may compensate for (e.g. offset) non-linear variations in the drive strength of an individual pull-up driver from one voltage to the next.

Though certain examples may be explained herein in the context of applying thermometer coding or other techniques to pull-up drivers, it is to be understood that the teachings herein may additionally or alternatively be applied to pull-down drivers. Further, though certain examples may be explained herein in the context of drivers included in memory devices, is to be understood that the teachings herein may additionally or alternatively be applied to drivers included in any type of electronic device.

Features of the disclosure are initially described in the context of systems and dies as described with reference to FIG. 1. Features of the disclosure are described in the context of circuits and diagrams as described with reference to FIGS. 2-5. These and other features of the disclosure are further illustrated by and described with reference to an apparatus diagram and flowcharts that relate to thermometer coding for driving non-binary signals as described with reference to FIGS. 6-8.

FIG. 1 illustrates an example of a system 100 that supports thermometer coding for driving non-binary signals in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The memory device 110 may include a device memory controller 155 and one or more memory dies 160 (e.g., memory chips) to support a desired capacity or a specified capacity for data storage. Each memory die 160 (e.g., memory die 160-*a*, memory die 160-*b*, memory die 160-N)

may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel. A signal path may be an example of a signal line as described herein.

Some channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

Signals communicated over the channels 115 may be modulated using one or more different modulation schemes. In some examples, a binary-symbol (or binary-level) modulation scheme may be used to modulate signals communicated between the host device 105 and the memory device 110. A binary-symbol modulation scheme may be an example of a M-ary modulation scheme where M is equal to two. Each symbol of a binary-symbol modulation scheme may be operable to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some examples, a non-binary (or multi-level) modulation scheme may be used to modulate signals communicated between the host device 105 and the memory device 110. A non-binary modulation scheme may be an example of a M-ary modulation scheme where M is greater than or equal to three. Each symbol of a non-binary modulation scheme may be operable to represent more than one bit of digital data (e.g., a symbol may represent a logic 00, a logic 01, a logic 10, or a logic 11). Examples of non-binary modulation schemes include, but are not limited to, PAM3, PAM4, PAM8, etc., quadrature amplitude modulation (QAM), quadrature phase shift keying (QPSK), and/or others. A non-binary signal (e.g., a PAM3 signal or a PAM4 signal) may be a signal that is modulated using a modulation scheme that includes at least three levels to encode more than one bit of information. non-binary modulation schemes and symbols may alternatively be referred to as non-binary, multi-bit, multi-level, multi-symbol, or higher-order modulation schemes and symbols. A voltage of a signal line may be an example of a non-binary symbol, where three or more target (e.g., candidate) voltage levels are associated with the modulation scheme. For example, where four target voltage levels are used, a voltage of a signal line may be an example of a PAM4 symbol.

A memory device 110 (or host device 105) may include any quantity of drivers each configured to drive a respective signal line (e.g., as included in a channel 115). For example, a memory die 160 may include such drivers. In some cases, a driver may be configured to drive a corresponding signal line to three or more voltages (e.g., representative of data read from or to be written to a memory array 170), in accordance with a non-binary modulation scheme. For example, the driver may include a set of pull-up drivers. In some examples, the set of pull-up drivers may include a first pull-up driver, a second pull-up driver, and a third pull-up driver. In some examples, the first pull-up driver may be calibrated at a first voltage of the three or more voltages and the driver may activate the first pull-up driver to drive the signal line to the first voltage. In some examples, the second pull-up driver may be calibrated at a second voltage of the three or more voltages and the driver may concurrently activate the first pull-up driver and the second pull-up to drive the signal line to the second voltage. In some cases, the third pull-up driver may be calibrated at a third voltage of the three or more voltages and the driver may concurrently activate the first pull-up driver, the second pull-up driver, and the third pull-up driver to drive the signal line to the third voltage. In such examples, the pull-up drivers may have different respective strengths (e.g., output impedances) that differ from each other in non-linear fashion (e.g., from one pull-up driver to the next, the respective strengths may increase at non-linear rate). For example, a difference between a first strength of the first pull-up driver and a second strength of the second pull-up driver may be different than a difference between the second strength and a third strength of the third pull-up driver.

Figure 2:
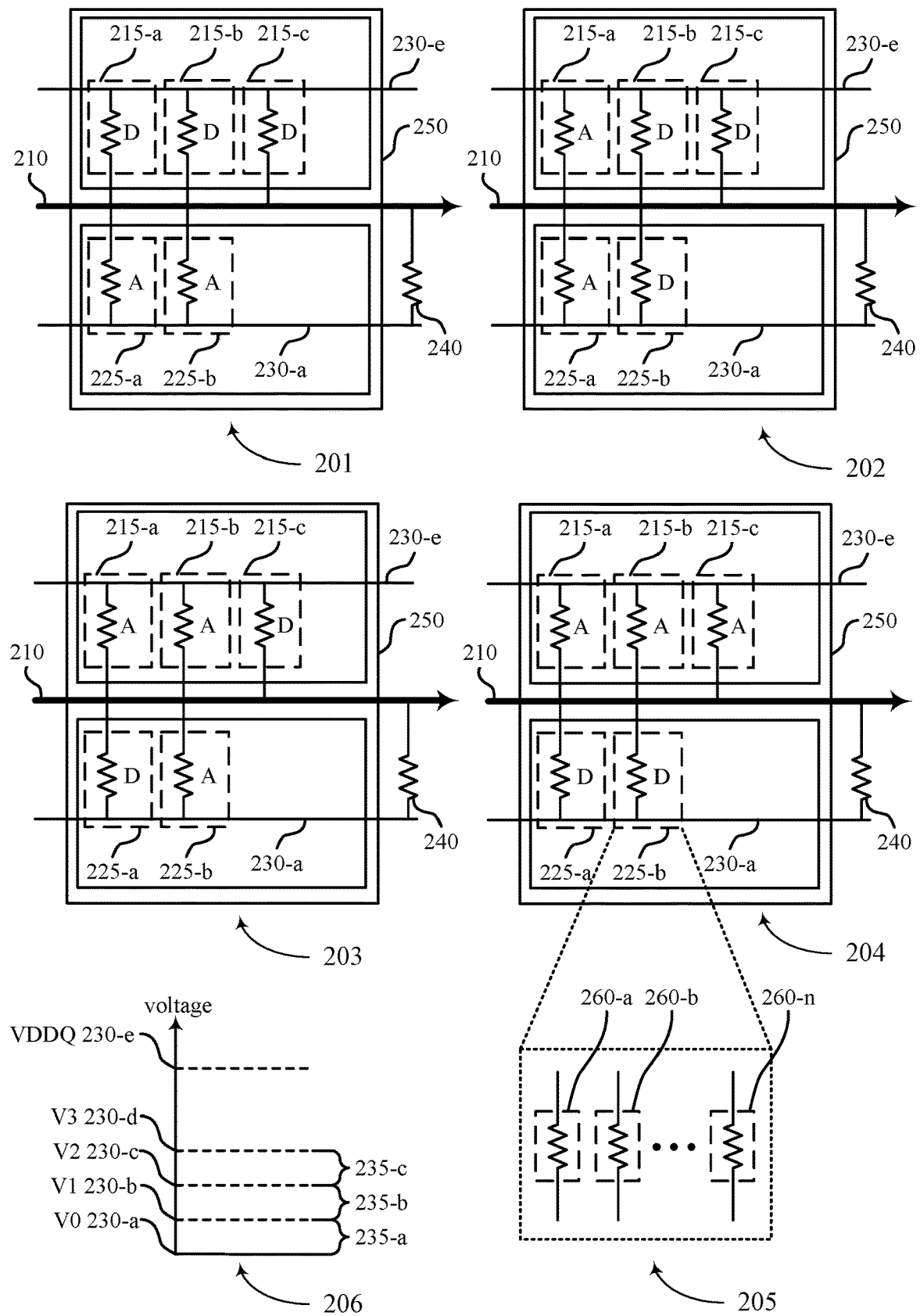
FIG. 2 illustrates examples of circuits that supports thermometer coding for driving non-binary signals in accordance with examples as disclosed herein.

FIG. 2 illustrates example circuit and voltage diagrams for a circuit that supports thermometer coding for driving non-binary signals in accordance with examples as disclosed herein. For example, FIG. 2 includes circuit diagrams 201, 202, 203, 204, and 205, along with voltage diagram 206. The circuit diagrams 201, 202, 203, and 204 each illustrate a same driver 250, which may be configured to drive to a signal line 210 to a set of different target voltages, and where the example target voltages are illustrated in voltage diagram 206. The driver 250 may, for example, be included in a memory device 110 as described with reference to FIG. 1 (e.g., may be included in a memory die 160). The signal line 210 may, for example, be included in or be an example of a channel 115 as described with reference to FIG. 1. The circuit diagram 205 indicates components that may be included in a pull-up driver 215 or pull-down driver 225 within the driver 250.

The signal line 210 may be associated with a termination impedance 240. The driver 250 may be configured to be impedance-matched with the termination impedance 240. The termination impedance 240 may be at an opposite end of the signal line as the driver 250 (e.g., the termination impedance 240 may be included a receiving device or may be coupled with the signal line 210 at a location along the signal line 210 that is between the driver 250 and the receiving device). In some examples, the termination impedance 240 may represent an effective impedance of the signal line 210 as observed from the perspective of the driver 250.

The voltage diagram 206 illustrates a first voltage 230-a (which may be referred to as V0), a second voltage 230-b (which may be referred to as V1), a third voltage 230-c (which may be referred to as V2), a fourth voltage 230-d (which may be referred to as V3). V0, V1, V2, and V3 may be examples of target voltages in accordance with a signaling scheme, such as target voltages in accordance with a PAM4 signaling scheme. In some examples, V0 may be equal to the voltage of a lower voltage supply or reference, which may be referred to as VSS. The voltage diagram 206 also illustrates a voltage VDDQ 230-e, which may be the voltage of an upper voltage supply or reference. Where VSS and V0 are 0V, for example, V3 may be equal to one half (three sixths) of VDDQ, V2 may be equal to one third (two sixths) of VDDQ, and V1 may be equal to one sixth of VDDQ. Hence, a voltage margin 235-a between V0 and V1 may be equal to one sixth of VDDQ, a voltage margin 235-b between V1 and V2 may also be equal to one sixth of VDDQ, and a voltage margin 235-c between V2 and V3 may also be equal to one sixth of VDDQ.

It is to be understood that any specific numeric examples described herein are provided solely for the sake of clarity in explanation and are not limiting of the claims. It is similarly to be understood that any specific quantities described herein (e.g., quantities of pull-up drivers 215, quantities of pull-down drivers 225) are provided solely for the sake of clarity in explanation and are not limiting of the claims.

The driver 250 may include a set of pull-up drivers 215 and a set of pull-down drivers 225. Circuit diagram 201 may illustrate operation of the driver 250 when the driver 250 is used to drive the signal line 210 to V0, circuit diagram 202 may illustrate operation of the driver 250 when the driver 250 is used to drive the signal line 210 to V1, circuit diagram 203 may illustrate operation of the driver 250 when the driver 250 is used to drive the signal line 210 to V2, and circuit diagram 204 may illustrate operation of the driver 250 when the driver 250 is used to drive the signal line 210 to V3. The driver 250 may drive the signal line to different voltages (e.g., the voltages of voltage diagram 206) to represent data stored at a memory device (e.g., within a memory array of the memory device).

Each pull-down driver 225 may be coupled with the signal line 210 and with the lower voltage supply or reference, VSS, which may be equal in voltage to V0. When activated, each pull-down driver 225 may be configured to couple the signal line 210 with VSS with a certain amount of impedance. Conversely, each pull-up driver 215 may be coupled with the upper voltage supply or reference, VDDQ. And when activated, each pull-up driver 215 may be configured to couple the signal line 210 with VDDQ with a certain amount of impedance. For example, the upper terminal (as illustrated) of each pull-up driver 215 may be coupled with VDDQ, and the lower terminal (as illustrated) of each pull-down driver 225 may be coupled with VSS. In the example illustrated in FIG. 2, the termination impedance 240 is coupled with VSS, but it is to be understood that the termination impedance 240 may be coupled with VDDQ in other examples.

When the driver 250 is operated as shown in circuit diagram 201 (with both pull-down drivers 225 activated and all pull-up drivers 215 deactivated), the driver 250 may drive the signal line 210 to V0 as the impedance between the signal line 210 and VDDQ may be very large (e.g., effectively infinite), while the impedance between the signal line 210 and VSS may be relatively small. The two pull-down drivers 225 may be configured such that, when activated in parallel as in circuit diagram 201, the combined impedance of the two pull-down drivers 225 is equal to the impedance of the termination impedance 240.

When the driver 250 is operated as shown in circuit diagram 202 (with the first pull-down driver 225-*a* activated, the first pull-up driver 215-*a* activated, and all other pull-down drivers 225 and pull-up drivers 215 deactivated), the driver 250 may drive the signal line 210 to V1 as the impedance between the signal line 210 and VDDQ may be five times larger than the impedance between the signal line 210 and VSS, thereby creating a voltage divider with a one sixth ratio. Further, the first pull-down driver 225-*a* and the first pull-up driver 215-*a* may be configured such that, when activated as in circuit diagram 202, the combined impedance of the first pull-down driver 225-*a* and the first pull-up driver 215-*a* (considered to be in parallel) is equal to the impedance of the termination impedance 240.

When the driver 250 is operated as shown in circuit diagram 203 (with the second pull-down driver 225-*b* activated, the first pull-up driver 215-*a* and second pull-up driver 215-*b* activated, and all other pull-down drivers 225 and pull-up drivers 215 deactivated), the driver 250 may drive the signal line 210 to V2 as the impedance between the signal line 210 and VDDQ may be two times larger than the impedance between the signal line 210 and VSS, thereby creating a voltage divider with a one third ratio. Further, the second pull-down driver 225-*b*, the first pull-up driver 215-*a*, and the second pull-up driver 215-*b* may be configured such that, when activated as in circuit diagram 203, the combined impedance of the second pull-down driver 225-*b*, first pull-up driver 215-*a*, and second pull-up driver 215-*b* (considered to be in parallel) is equal to the impedance of the termination impedance 240.

When the driver 250 is operated as shown in circuit diagram 204 (with both pull-down drivers 225 deactivated and all pull-up drivers 215 activated), the driver 250 may drive the signal line 210 to V3 as the impedance between the signal line 210 and VDDQ may be equal to the impedance between the signal line 210 and VSS, thereby creating a voltage divider with a one half ratio. Further, the first pull-up driver 215-*a*, the second pull-up driver 215-*b*, and the third pull-up driver 215-*c* may be configured such that, when activated in parallel as in circuit diagram 204, the combined impedance of the first pull-up driver 215-*a*, second pull-up driver 215-*b*, and third pull-up driver 215-*c* is equal to the impedance of the termination impedance 240.

Each pull-up driver 215 and pull-down driver 225 may include a respective quantity of driver elements 260, which may alternatively be referred to as driver legs. Circuit diagram 205, shown as a blowout of the second pull-down driver 225-*b* as illustrated in circuit diagram 204, may be representative of the driver elements 260 that may be included in any pull-up driver 215 or pull-down driver 225. Each driver element 260 may comprise one or more transistors, one or more resistive components, or any combination thereof. The resistors shown in each pull-up driver 215, pull-down driver 225, and driver element 260 of FIG. 2 may be a symbolic representation of an impedance (e.g., output impedance) of the pull-up driver 215, pull-down driver 225, or driver element 260, and each pull-up driver 215, pull-down driver 225, or driver element 260 may comprise one or more additional or alternative components. Each driver element 260 may be operable to couple a first terminal (e.g., upper terminal as illustrated in FIG. 2) of the driver element 206 with a second terminal (e.g., lower terminal as illustrated in FIG. 2) of the driver element 206 when the driver element 260 is activated (e.g., when a pull-up driver 215 or pull-down driver 225 that includes the driver element 260 is activated) and to decouple the first terminal of the driver element 206 from the second terminal of the driver element 206 when the driver element 260 is deactivated (e.g., when a pull-up driver 215 or pull-down driver 225 that includes the driver element 260 is deactivated).

A pull-up driver 215 or pull-down driver 225 may include any quantity of driver elements 260, which may be coupled with each other in parallel. The more driver elements 260 included in a pull-up driver 215 or pull-down driver 225, the greater the strength (e.g. the lower the output impedance) the pull-up driver 215 or pull-down driver 225 may have when activated. The strength of each individual driver element 260 may be non-linear as a function of voltage (e.g., an output impedance of the driver element 260 may vary in non-linear fashion as a function of the voltage differential between the first and second terminals of the driver element 260). Because of the non-linear behavior of each constituent driver element 260, the strength of each pull-up driver 215 or pull-down driver 225 may likewise be non-linear as a function of voltage (e.g., an overall impedance of the pull-up driver 215 or pull-down driver 225 may vary in non-linear fashion as a function of the output voltage of the pull-up driver 215 or pull-down driver 225, which may be based on or otherwise correspond to the voltage differential between the first and second terminals of the constituent driver elements 260).

Further, in some cases, the quantity of driver elements 260 that are activated when a corresponding pull-up driver 215 or pull-down driver 225 is activated may be controlled by a code, which may be referred to as a strength code for the pull-up driver 215 or pull-down driver 225. That is, when a pull-up driver 215 or pull-down driver 225 is activated, a configurable quantity of the driver elements 260 within the pull-up driver 215 or pull-down driver 225 may be activated (e.g., in some cases, only a subset of the driver elements 260 within the pull-up driver 215 or pull-down driver 225 may be activated). For example, when a pull-up driver 215 or pull-down driver 225 is activated using a first strength code, a first quantity of driver elements 260 may be activated, and when the pull-up driver 215 or pull-down driver 225 is activated using a second strength code, a second quantity of driver elements 260 may be activated.

In the example illustrated in FIG. 2, the pull-down drivers 225 may be configured to be operated according to a binary coding scheme. For example, there are two pull-down drivers 225 in the example of FIG. 2, and the first pull-down driver 225-*a* may correspond to a most significant bit (MSB) of a binary code, while the second pull-down driver 225-*b* may correspond to a least significant bit of the binary code. The binary coding scheme may alternatively be referred to as an MSB/LSB coding scheme. The binary code may correspond to a logic value of the bits represented by a target voltage to which the driver 250 is to drive the signal line 210. For example, V0 may represent two bits corresponding to a logic value (and hence a binary code) of 00, V1 may represent two bits corresponding to a logic value (and hence a binary code) of 01, V2 may represent two bits corresponding to a logic value (and hence a binary code) of 10, and V3 may represent two bits corresponding to a logic value (and hence a binary code) of 11. The first pull-down driver 225-*a* may be activated or deactivated based on a logic value of the MSB (e.g., in active low fashion as shown in the example of FIG. 2, meaning activated when the MSB is 0 and deactivated when the MSB is 1). The second pull-down driver 225-*b* may be activated or deactivated based on a logic value of the LSB (e.g., in active low fashion as shown in the example of FIG. 2, meaning activated when the LSB is 0 and deactivated when the LSB is 1).

In some examples, the first pull-down driver 225-a may be configured to nominally have twice the drive strength when activated—and hence half the impedance—as the second pull-down driver 225-b. The first pull-down driver 225-a may be restricted to having twice the nominal drive strength of the second pull-down driver 225-b because, for example, in a binary numbering system, the weight of the MSB may be double the weight of the LSB. Thus, the first pull-down driver 225-a may include twice as many driver elements 260 as the second pull-down driver 225-b (e.g., activating the first pull-down driver 225-a may involve activating twice as many driver elements 260 as activating the second pull-down driver 225-b).

For a set of drivers (e.g., a set of pull-up drivers 215 or a set of pull-down drivers 225) operated according to a binary coding scheme, such as the set of pull-down drivers 225 in the example of FIG. 2, the total quantity of activated driver elements 260 may vary (e.g., scale) linearly across the different target voltages of a modulation scheme. For example, when the driver 250 drives the signal line 210 to V3 as in circuit diagram 204, both the first pull-down driver 225-a and the second pull-down driver 225-b may both be deactivated, and hence the total quantity of activated pull-down driver elements 260 included in the driver 250 may be zero. When the driver 250 drives the signal line 210 to V2 as in circuit diagram 203, the first pull-down driver 225-a may be deactivated and the second pull-down driver 225-b may be activated, and hence the total quantity of activated pull-down driver elements 260 included in the driver 250 may be X (where X represents the quantity of pull-down driver elements 260 included in the second pull-down driver 225-b—e.g., configured to be activated when the second pull-down driver 225-b is activated). When the driver 250 drives the signal line 210 to V1 as in circuit diagram 202, the first pull-down driver 225-a may be activated and the second pull-down driver 225-b may be deactivated, and hence the total quantity of activated pull-down driver elements 260 included in the driver 250 may be 2X (where 2X represents the quantity of pull-down driver elements 260 included in the first pull-down driver 225-a—e.g., configured to be activated when the first pull-down driver 225-a is activated). And when the driver 250 drives the signal line 210 to V0 as in circuit diagram 201, both the first pull-down driver 225-a and the second pull-down driver 225-b may both be activated, and hence the total quantity of activated pull-down driver elements 260 included in the driver 250 may be 3X. Thus, for a set of drivers operated according to a binary coding scheme, the total quantity of activated pull-down driver elements 260 may vary (e.g., scale) linearly across the different target voltages of the modulation scheme—e.g., as a linear sequence of 0, X, 2X, 3X.

The pull-up drivers 215 may be configured to be operated according to a thermometer coding scheme, which may alternatively be referred to as a unary coding scheme. For example, there are three pull-up drivers 215 in the example of FIG. 2, and the three pull-up drivers 215 may be operated based on thermometer code corresponding to a logic value of the bits represented by a target voltage to which the driver 250 is to drive the signal line 210. For example, V0 may represent two bits corresponding to a logic value (and hence a binary code) of 00, which may correspond to a thermometer code of 000—that is, a thermometer code of 000 may correspond to a binary code of 00, as both may correspond to a decimal value of zero. V1 may represent two bits corresponding to a logic value (and hence a binary code) of 01, which may correspond to a thermometer code of 001—that is, a thermometer code of 001 may correspond to a binary code of 01, as both may correspond to a decimal value of one. V2 may represent two bits corresponding to a logic value (and hence a binary code) of 10, which may correspond to a thermometer code of 011—that is, a thermometer code of 011 may correspond to a binary code of 10, as both may correspond to a decimal value of two. And V3 may represent two bits corresponding to a logic value (and hence a binary code) of 11, which may correspond to a thermometer code of 111—that is, a thermometer code of 111 may correspond to a binary code of 11, as both may correspond to a decimal value of three.

For a set of drivers (e.g., a set of pull-up drivers 215 or a set of pull-down drivers 225) operated according to a thermometer coding scheme, each bit of a thermometer code may control whether a corresponding driver is activated or deactivated. For example, using a three-bit thermometer code as in the example of FIG. 2: The first pull-up driver 215-a may be activated or deactivated based on a logic value of the last bit of the thermometer code and thus activated when the thermometer code is 001, 011, or 111 (e.g., in active high fashion as shown in the example of FIG. 2, meaning activated when the last bit is 1 and deactivated when the last bit is 0). The second pull-up driver 215-b may be activated or deactivated based on a logic value of the middle bit of the thermometer code and thus activated when the thermometer code is 011 or 111 (e.g., in active high fashion as shown in the example of FIG. 2, meaning activated when the middle bit is 1 and deactivated when the middle bit is 0). The third pull-up driver 215-c may be activated or deactivated based on a logic value of the first bit of the thermometer code and thus activated when the thermometer code is 111 (e.g., in active high fashion as shown in the example of FIG. 2, meaning activated when the first bit is 1 and deactivated when the first bit is 0).

Thus, a quantity of activated drivers within the set of driver may be equal to a quantity of bits within the thermometer code having a particular logic value (e.g., equal to a quantity of ones within the thermometer code). For example, a thermometer code that includes a single one may activate a single driver (e.g., the first pull-up driver 215-a). A thermometer code that includes two ones may activate two drivers (e.g., the first pull-up driver 215-a and the second pull-up driver 215-b). And a thermometer code that includes three ones may activate three drivers (e.g., the first pull-up driver 215-a, the second pull-up driver 215-b, and the third pull-up driver 215-c).

For a set of drivers (e.g., a set of pull-up drivers 215 or a set of pull-down drivers 225) operated according to a thermometer coding scheme, such as the set of pull-up drivers 215 in the example of FIG. 2, the total quantity of activated driver elements 260 may be configured to vary (e.g., scale) non-linearly across the different target voltages of a modulation scheme. For example, when the driver 250 drives the signal line 210 to V0 as in circuit diagram 201, each of the pull-up drivers 215 may be deactivated, and hence the total quantity of activated pull-up driver elements 260 included in the driver 250 may be zero. When the driver 250 drives the signal line 210 to V1 as in circuit diagram 202, the first pull-up driver 215-a may be activated and each other pull-up driver 215 may be deactivated, and hence the total quantity of activated pull-up driver elements 260 included in the driver 250 may be X (where X represents the quantity of pull-up driver elements 260 included in the first pull-up driver 215-a—e.g., configured to be activated when the first pull-up driver 215-a is activated). When the driver 250 drives the signal line 210 to V2 as in circuit diagram 203, the first pull-up driver 215-a and second pull-up driver 215-b may be activated while the third pull-up driver 215-b may be deactivated, and hence the total quantity of activated pull-up driver elements 260 included in the driver 250 may be Y, where Y is any quantity greater than X, and thus not necessarily 2X (e.g., the total quantity of activated pull-up driver elements 260 may be 1.8X, if 0.8X pull-up driver elements 260 are included in the second pull-up driver 215-b). And when the driver 250 drives the signal line 210 to V3 as in circuit diagram 204, all three of the pull-up drivers 215 may be activated, and hence the total quantity of activated pull-down driver elements 260 included in the driver 250 may be Z, where Z is any quantity greater than Y, and thus not necessarily Y+X (e.g., the total quantity of activated pull-up driver elements 260 may be 2.3X, if 0.5X pull-up driver elements 260 are included in the second pull-up driver 215-b). Thus, for a set of drivers operated according to a thermometer coding scheme, the total quantity of activated pull-down driver elements 260 may vary (e.g., scale) non-linearly across the different target voltages of the modulation scheme—e.g., as a non-linear sequence of 0, X, 1.8X, 2.3X.

Operating a set of drivers according to a thermometer coding scheme thus may support a non-linear scaling (e.g., variation) in terms of a quantity of activated driver elements 260 across different target voltages of a modulation scheme. This may be beneficial, for example, because such non-linear scaling of the quantity of activated driver elements 260 may be configured to counteract (e.g., mitigate, offset, compensate for) the non-linearity of the individual driver elements 260.

For example, at an output voltage of V1, a driver element 260 may have a drive strength of S. But at an output voltage of V2, the same driver element 260 may have a driver strength of 1.1S, and at an output voltage of V3, the same driver element 260 may have a driver strength of 1.3S. That is, the same pull-up driver element 260 may have different strengths (and hence different impedances) when operated at different voltages. Further, the strength (and hence the impedance) of the driver element 260 may vary in non-linear fashion across different operating (e.g., output) voltages (e.g., as a sequence of 0, S, 1.1S, and 1.3S).

If a set of drivers is operated according to a binary coding scheme, in which the quantity of activated driver elements 260 may vary in linear fashion across different target voltages of a modulation scheme, the non-linearity of the driver elements 260 within the drivers may be uncompensated, and as a result, the total drive strength (e.g., total impedance) for the set of drivers may vary in non-linear fashion across the different target voltages. For instance, if the total quantity of activated driver elements 260 may vary across the different target voltages of the modulation scheme as a linear sequence of 0, X, 2X, 3X (as described above), and the strength of each individual driver element 260 may vary as in the above example (e.g., as a sequence of 0, S, 1.1S, and 1.3S), total drive strength may vary as a non-linear sequence of 0, X*S, 2.2X*S, and 3.9X*S (and total impedance may vary in similar non-linear fashion, but as the inverse of total drive strength). That is, the non-linearity of the individual driver elements 260 may be carried through to result in non-linear total drive strength for the set of drivers. Such non-linearity in total drive strength may cause the voltage margins 235 to vary relative to one another, may cause one or more of the voltage margins 235 to be undesirably small, or any combination thereof, which may diminish the reliability which signaling transmitted (e.g., generated) using the driver 250 may be decoded by a receiving device.

If, however, a set of drivers is operated according to a thermometer coding scheme, in which the quantity of activated driver elements 260 may vary in non-linear fashion across different target voltages of a modulation scheme, the non-linearity of the driver elements 260 within the drivers may be counteracted by the non-linearity of the quantity of activated driver elements 260, which may be non-linear in an opposite direction, and as a result, the total drive strength (e.g., total impedance) for the set of drivers may vary in linear (or at least more linear) fashion across the different target voltages. For instance, if the total quantity of activated driver elements 260 may vary across the different target voltages of the modulation scheme as a non-linear sequence of 0, X, 1.8X, 2.3X (as described for the thermometer coding example above), and the strength of each individual driver element 260 may vary as in the above example (e.g., as a sequence of 0, S, 1.1S, and 1.3S), total drive strength may vary as a substantially linear sequence of 0, X*S, 1.98X*S, and 2.99X*S (and total impedance may vary in similar substantially linear fashion, but as the inverse of total drive strength). That is, the non-linearity of the individual driver elements 260 across the different target voltages may be compensated by the non-linearity of the different quantities of activated driver elements 260 across the different target voltages, thereby resulting in linear (or at least more linear) total drive strength for the set of drivers across the different target voltages. Such linearity in total drive strength, as facilitated by the use of thermometer coding to control the different drivers within the set of drivers, may cause the voltage margins 235 to be equal (or at least more equal) in size relative to one another, may avoid one or more of the voltage margins 235 becoming undesirably small, or any combination thereof, which may improve the reliability which signaling transmitted (e.g., generated) using the driver 250 may be decoded by a receiving device.

In the example of FIG. 2, the pull-up drivers 215 within the driver 250 are operated according to a thermometer coding scheme while the pull-down drivers 225 within the driver 250 are operated according to a binary coding scheme. It is to be understood, however, that in some examples, the pull-down drivers 225 within a driver 250 may in other examples be operated according to a thermometer coding scheme (e.g., there may instead be three pull-down drivers 225) while the pull-up drivers 215 within the driver 250 are operated according to a binary coding scheme (e.g., there may instead be two pull-up drivers 215). It is also to be understood, that in some examples, the pull-up drivers 215 and the pull-down drivers 225 within a driver 250 may both be operated according to a thermometer coding scheme (e.g., the driver 250 may include a same quantity of pull-down drivers 225 as pull-up drivers 215).

Figure 3:
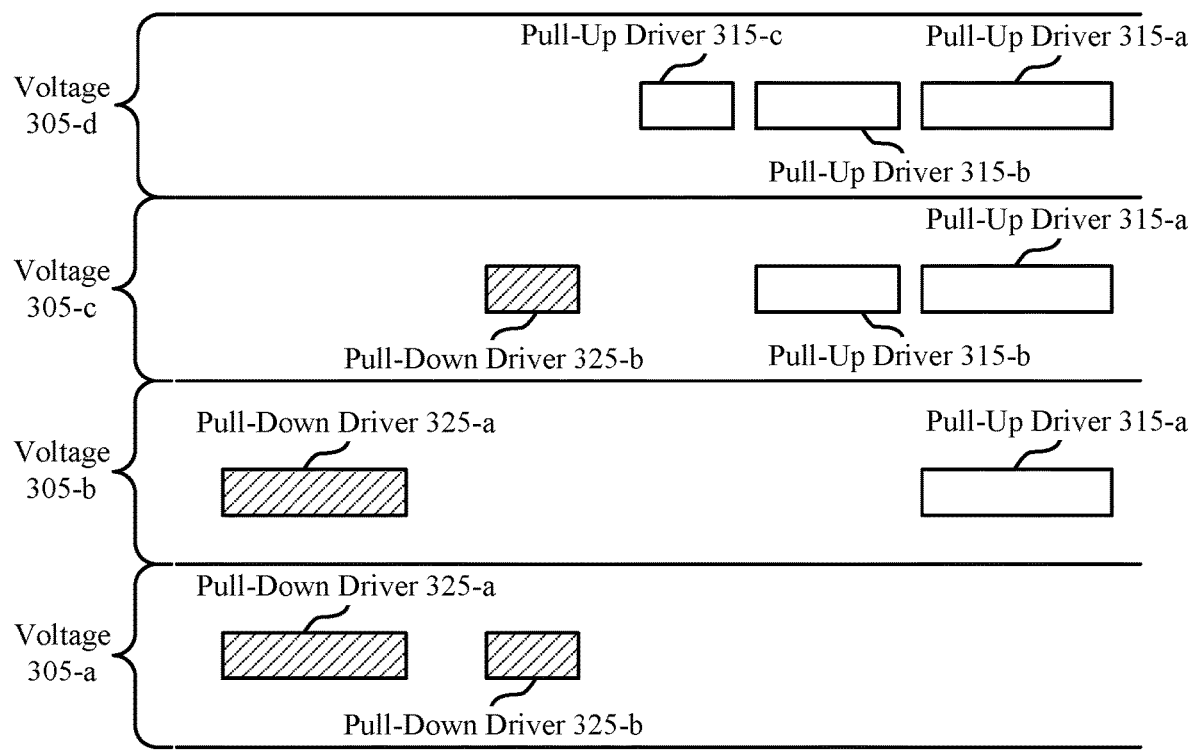
FIG. 3 illustrates an example of a diagram that supports thermometer coding for driving non-binary signals in accordance with examples as disclosed herein.

FIG. 3 illustrates an example of a diagram 300 that supports thermometer coding for driving non-binary signals in accordance with examples as disclosed herein. Diagram 300 may illustrate possible combinations of drivers used to drive a signal line (e.g., a signal line 210 as described with reference to FIG. 2) to a voltage of three or more voltages (e.g., voltages 230 as described with reference to FIG. 2). In some examples, diagram 300 may illustrate activating or deactivating pull-up drivers 315 (e.g., pull-up drivers 215 as described with reference to FIG. 2) and pull-down drivers 325 (e.g., pull-down drivers 225 as described with reference to FIG. 2).

In some instances, a driver (e.g., a driver 250 as described with reference to FIG. 2) may drive a signal line (e.g., signal line 210) to a first voltage 305-*a* (e.g., voltage 230-*a* as described with reference to FIG. 2) of three of more voltages by activating a first pull-down driver 325-*a* (e.g., first pull-down driver 225-*a*) and a second pull-down driver 325-*b* (e.g., pull-down driver 225-*b*). The first voltage 305-*a* may be representative of data stored in a memory array (e.g., memory array 170 as described with reference to FIG. 2). In some examples, the pull-down drivers 325 may be operated based on a binary code, which may correspond to the logic value represented by the voltage to which the signal line is driven. For example, the first pull-down driver 325-*a* may transmit (e.g., be activated or deactivated based on a value of) a most significant bit (MSB) and the second pull-down driver 325-*b* may transmit (e.g., be activated or deactivated based on a value of) a least significant bit (LSB) of a set of two bits represented by the voltage to which the signal line is driven. For example, the first voltage 305-*a* may represent a logic value 00 (e.g., may represent two bits each having a logic value 0), and the first pull-down driver 325-*a* may be activated based on the MSB having a logic value 0, while the second pull-down driver 325-*b* may be activated based on the LSB having a logic value 0. In such examples, the first pull-down driver 325-*a* may have substantially twice the drive strength (e.g., include twice as many activated driver elements—such as driver elements 260—when activated, have substantially half the impedance when activated, or both) of the second pull-down driver 325-*b*.

In some examples, the pull-up drivers 315 may be operated based on a thermometer code, which may correspond to the logic value represented by the voltage to which the signal line is driven, but using thermometer coding (e.g., rather than binary coding). An additional bit within the thermometer code may be set to a particular (e.g. high) logic value for each successive voltage 305 associated with the signaling scheme, and each pull-up driver 315 may be activated or deactivated based on the logic value of a respective bit of thermometer code, such than an additional pull-up driver 315 may be activated for each successive voltage 305 as illustrated in FIG. 3. For example, the first voltage 305-*a* may correspond to binary logic value and hence also a binary code of 00, which may correspond to a thermometer code of 000. Hence, the driver may drive the signal line to the first voltage 305-*a* by, concurrent with activating the first pull-down driver 325-*a* and the second pull-down driver 325-*b*, deactivating the first pull-up driver 315-*a* (e.g., first pull-up driver 215-*a*) based on the last bit of the thermometer code being a logic 0, a second pull-up driver 315-*b* (e.g., second pull-up driver 215-*b*) based on the middle bit of the thermometer code being a logic 0, and a third pull-up driver 315-*c* (e.g., second pull-up driver 215-*a*) based on the first bit of the thermometer code being a logic 0.

In other instances, the driver may drive the signal line to a second voltage 305-*b* (e.g., voltage 230-*b* as described with reference to FIG. 2), which may be representative of data stored in the memory array. For example, the second voltage 305-*b* may represent two bits corresponding to a binary logic value of 01, which may correspond to a binary code of 01 and a thermometer code of 001. Accordingly, to drive the signal line to the second voltage 305-*b*, the first pull-down driver 325-*a* may be activated (based on the MSB having the logic value 0), and the second pull-down driver 325-*b* may be deactivated (based on the LSB having the logic value 0). Concurrently, to drive the signal line to the third voltage 305-*b*, the first pull-up driver 315-*a* may be activated (based on the last bit of the thermometer code having the logic value 1), the second pull-up driver 315-*b* may be deactivated (based on the middle bit of the thermometer code having the logic value 0), and third pull-up driver 315-*c* may be deactivated (based on the first bit of the thermometer code having the logic value 0).

In other instances, the driver may drive the signal line to a third voltage 305-*c* (e.g., voltage 230-*c* as described with reference to FIG. 2), which may be representative of data stored in the memory array. For example, the third voltage 305-*c* may represent two bits corresponding to a binary logic value of 10, which may correspond to a binary code of 10 and a thermometer code of 011. Accordingly, to drive the signal line to the third voltage 305-*c*, the first pull-down driver 325-*a* may be deactivated (based on the MSB having the logic value 1), and the second pull-down driver 325-*b* may be activated (based on the LSB having the logic value 1). Concurrently, to drive the signal line to the third voltage 305-*c*, the first pull-up driver 315-*a* may be activated (based on the last bit of the thermometer code having the logic value 1), the second pull-up driver 315-*b* may be activated (based on the middle bit of the thermometer code having the logic value 1), and third pull-up driver 315-*c* may be deactivated (based on the first bit of the thermometer code having the logic value 0).

In other instances, the driver may drive the signal line to a fourth voltage 305-*d* (e.g., voltage 230-*d* as described with reference to FIG. 2), which may be representative of data stored in the memory array. For example, the third voltage 305-*c* may represent two bits corresponding to a binary logic value of 11, which may correspond to a binary code of 11 and a thermometer code of 111. Accordingly, to drive the signal line to the fourth voltage 305-*d*, the first pull-down driver 325-*a* may be deactivated (based on the MSB having the logic value 1), and the second pull-down driver 325-*b* may also be deactivated (based on the LSB having the logic value 1). Concurrently, to drive the signal line to the fourth voltage 305-*c*, the first pull-up driver 315-*a* may be activated (based on the last bit of the thermometer code having the logic value 1), the second pull-up driver 315-*b* may be activated (based on the middle bit of the thermometer code having the logic value 1), and third pull-up driver 315-*c* may also be activated (based on the first bit of the thermometer code having the logic value 1). Thus, at each successive voltage 305, an additional pull-up driver 315 may be activated (zero activated pull-up drivers 315 at the first voltage 305-*a*, one activated pull-up driver 315 at the second voltage 305-*b*, two activated pull-up drivers 315 at the third voltage 305-*b*, and three activated pull-up drivers 315 at the fourth voltage 305-*c*).

In some examples, each pull-down driver 325 and pull-up driver 315 may be calibrated to have a calibrated impedance at a respective one of the voltages 305. For example, a strength code for use in activating a pull-down driver 325 or pull-up driver 315 may be determined based on operating the pull-down driver 325 or pull-up driver 315 at a respective one of the voltages 305, where a quantity of activated driver elements included in a pull-down driver 325 or pull-up driver 315 may depend on (e.g., correspond to, be controlled by) the strength code used to activate the pull-down driver 325 or pull-up driver 315.

Because the first pull-down driver 325-*a* is the only pull-down driver 325 activated to drive the signal line to the second voltage 305-*b*, the first pull-down driver 325-*a* may be calibrated at the second voltage 305-*b* (e.g., a strength code used to activate the first pull-down driver 325-*a* may be determined based on operating the first pull-down driver 325-*a* to have an output voltage equal to the second voltage 305-*b*). Similarly, because the second pull-down driver 325-*b* is the only pull-down driver 325 activated to drive the signal line to the third voltage 305-*c*, the second pull-down driver 325-*b* may be calibrated at the third voltage 305-*c* (e.g., a strength code used to activate the second pull-down driver 325-*b* may be determined based on operating the second pull-down driver 325-*b* to have an output voltage equal to the third voltage 305-*c*). As shown in the example of FIG. 3, the first pull-down driver 325-*a* and the second pull-down driver 325-*b* both may also be used (e.g., activated) to drive the signal line to the first voltage 305-*a*. Due to one or more non-linearities associated with pull-down drivers 325 (e.g., non-linearities of the driver elements thereof), however, the first pull-down driver 325-*a* may have a different drive strength (e.g., different impedance) when activated at the first voltage 305-*a* than when activated at the second voltage 305-*b*, and the second pull-down driver 325-*b* may have a different drive strength (e.g., different impedance) when activated at the first voltage 305-*a* than when activated at the third voltage 305-*c*. That is, when activated at the first voltage 305-*a*, the impedance of the first pull-down driver 325-*a* may be different than its calibrated impedance, and impedance of the second pull-down driver 325-*b* may be different than its calibrated impedance. Such impedance deviations may cause the signal line to be driven to a non-ideal voltage (e.g., a voltage different than an ideal target voltage for the first voltage 305-*a*), which may adversely impact the reliability with which a receiving device may decode signaling generated by the driver.

Operating a set of drivers based on thermometer coding may beneficially avoid (or at least reduce) the impact of such impedance deviations (e.g., deviations of a driver impedance when activated at different voltages). For example, because the first pull-up driver 315-*a* is the only pull-up driver 315 activated to drive the signal line to the second voltage 305-*b*, the first pull-up driver 315-*a* may be calibrated at the second voltage 305-*b* (e.g., a strength code used to activate the first pull-up driver 315-*a* may be determined based on operating the first pull-up driver 315-*a* to have an output voltage equal to the second voltage 305-*b*). To drive the signal line to the third voltage 305-*c*, the second pull-up driver 315-*b* may be used (e.g., activated) in conjunction with the first pull-up driver 315-*a*. Thus, the second pull-up driver 315-*b* may be calibrated at the third voltage 305-*c* so as to provide—in combination with the first pull-up driver 315-*a* when operated at the third voltage 305-*c*—a desired amount of total pull-up drive strength. That is, the impedance of the first pull-up driver 315-*a* when operated at the third voltage 305-*c* may be different than the calibrated impedance of the first pull-up driver 315-*a* (due to the first pull-up driver 315-*a* being calibrated for operation at the second voltage 305-*b*), but because the second pull-up driver 315-*b* may not be activated other than in conjunction with at least the first pull-up driver 315-*a*, the second pull-up driver 315-*b* may be calibrated (e.g., configured to include a calibrated quantity of activated driver elements when activated) so as to compensate for the non-linearity of the first pull-up driver 315-*a*, such that the first pull-up driver 315-*a* and the second pull-up driver 315-*b* provide a total desired drive strength (e.g., have a desired combined impedance) when jointly activated at the third voltage 305-*c*.

Similarly, to drive the signal line to the fourth voltage 305-*d*, the third pull-up driver 315-*c* may be used (e.g., activated) in conjunction with the first pull-up driver 315-*a* and the second pull-up driver 315-*b*. Thus, the third pull-up driver 315-*c* may be calibrated at the fourth voltage 305-*d* so as to provide—in combination with the first pull-up driver 315-*a* and the second pull-up driver 315-*b* when operated at the third voltage 305-*c*—a desired amount of total pull-up drive strength. That is, the respective impedances of the first pull-up driver 315-*a* and the second pull-up driver 315-*b* when operated at the fourth voltage 305-*d* may be different than the respective calibrated impedances of the first pull-up driver 315-*a* and the second pull-up driver 315-*b* (due to the first pull-up driver 315-*a* being calibrated for individual operation at the second voltage 305-*b*, and the second pull-up driver 315-*b* being calibrated for joint operation with the first pull-up driver 315-*a* at the third voltage 305-*c*), but because the third pull-up driver 315-*c* may not be activated other than in conjunction with at least the first pull-up driver 315-*a* and the second pull-up driver 315-*b*, the third pull-up driver 315-*c* may be calibrated (e.g., configured to include a calibrated quantity of activated driver elements when activated) so as to compensate for the non-linearities of the first pull-up driver 315-*a* and the second pull-up driver 315-*b*, such that the first pull-up driver 315-*a*, the second pull-up driver 315-*b*, and the third pull-up driver 315-*c* provide a total desired drive strength (e.g., have a desired combined impedance) when jointly activated at the fourth voltage 305-*d*.

Thus, operating a set of drivers in accordance with thermometer coding as described herein (e.g., such as the set of pull-up drivers 315) may mitigate the impact of the non-linearity of the individual drivers within the set of drivers. For example, each driver of the set may be calibrated to provide a calibrated amount of incremental drive strength at a particular voltage, which may compensate for the non-linearity of any other driver of the set that is to be activated concurrently at that particular voltage. Further, an individual driver of the set may be desired to provide any amount of calibrated drive strength when activated (e.g., may not be restricted to any particular relationship relative to the calibrated drive strength of some other driver of the set). For example, the amount of incremental drive strength (e.g., incremental quantity of activated driver elements) added by the different drivers of the set may be in accordance with a non-linear sequence, which may counteract the individual non-linearities of the drivers. As one such example, the calibrated drive strength of the second pull-up driver 315-*b* may be less than the calibrated drive strength of the first pull-up driver 315-*a*, but the actual drive strength of the first pull-up driver 315-*a* at the third voltage 305-*c* may be greater than the calibrated drive strength of the first pull-up driver 315-*a* (e.g., the same quantity of activated driver elements within the first pull-up driver 315-*a* may provide greater actual driver strength at the third voltage 305-*c* than at the second voltage 305-*b*), such that the total pull-up drive strength may vary linearly from the first voltage 305-*a* to the second voltage 305-*b* to the third voltage 305-*c* even if the drive strength of the first pull-up driver 315-*a* varies non-linearly. Similarly, the calibrated drive strength of the third pull-up driver 315-*c* may be less than the calibrated drive strength of the second pull-up driver 315-*b*, but the actual drive strength of the second pull-up driver 315-*b* at the fourth voltage 305-*d* may be greater than the calibrated drive strength of the first second pull-up driver 315-*b*, and the actual drive strength of the first pull-up driver 315-*a* at the fourth voltage 305-*d* may be greater than the calibrated drive strength of the first pull-up driver 315-*a*, such that the total pull-up drive strength may vary linearly across the voltages 305 even if the drive strengths of the individual pull-up drivers vary non-linearly. Accordingly, a driver than includes the set of driver may signal the voltages 305 more accurately and achieve greater equality with respect to the differences between the voltages (e.g., achieve more equal voltage margins 235).

Figure 4:
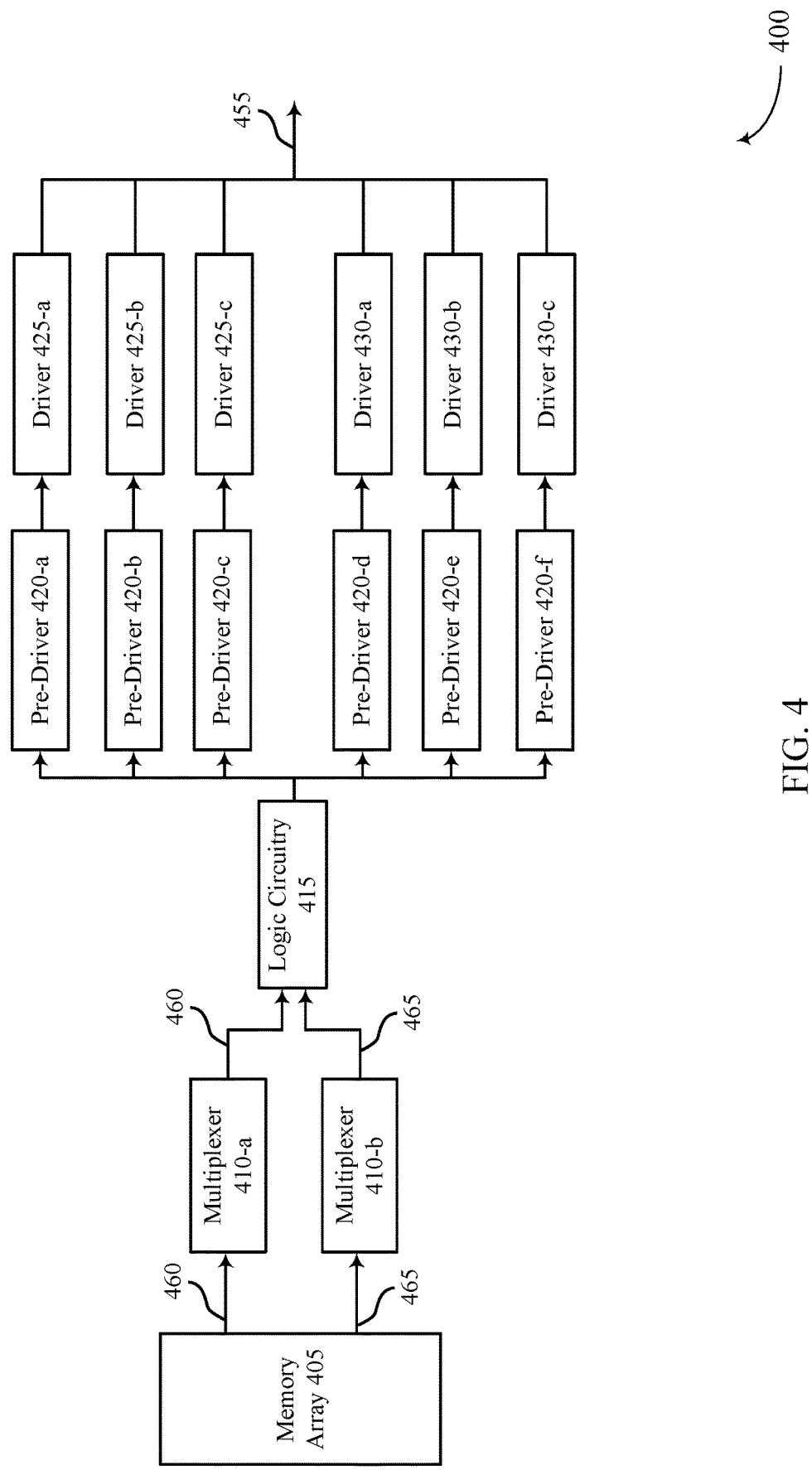
FIG. 4 illustrates an example of a circuit that supports thermometer coding for driving non-binary signals in accordance with examples as disclosed herein.

FIG. 4 illustrates an example of a circuit 400 that supports thermometer coding for driving non-binary signals in accordance with examples as disclosed herein. The circuit 400 may be or include aspects of a driver for transmitting (e.g., signaling) data from a memory array 405 to a signal line 455. The circuit 400 may include a memory array 405, multiplexers 410, logic circuitry 415, pre-drivers 420, and drivers 425-a, 425-b, 425-c, 430-a, 430-b, and 430-c. In some examples, driver 465425-a may be an example of a first pull-up driver 315-a, driver 425-b may be an example of a second pull-up driver 315-b, and driver 425-c may be an example of a third pull-up driver 315-c as described with reference to FIG. 3. And in some cases, drivers 430-a, 430-b and 430-c may be pull-down drivers (e.g., examples pull-down drivers 225 or 325 as described with reference to FIGS. 2 and 3). Although three pull-down drivers 430-a, 430-b, and 430-c are shown, in some examples, there may be two pull-down drivers 430-a and 430-b—e.g., driver 430-c may be omitted.

Memory array 405 (e.g., memory array 170 as described with reference to FIG. 1) may be configured to store for a memory device (e.g., memory device 110 as described with reference to FIG. 1). In some examples, the memory array 405 may be configured to transmit a first data signal 460 (e.g., first bitstream or other stream of data) to the multiplexer 410-a and transmit a second data signal 465 (e.g., a second bitstream or other stream of data) to the multiplexer 410-b. In some examples, the first data signal 460 and second data signal 465 may represent a binary code associated with a PAM4 modulation scheme. For instance, first data signal 460 may be an MSB and second data signal 465 may be an LSB, or vice versa.

Multiplexer 410-a may be configured to receive the first data signal 460, serialize the first data signal 460, and output the serialized first data signal 460 to the logic circuitry 415. In some examples, multiplexer 410-b may be configured to receive the second data signal 465, serialize the second data signal 465, and output the serialized second data signal 465 to the logic circuitry 415. For example, each multiplexer 410 may receive a stream of data comprising a plurality of symbols. In some examples, a stream of data transmitted from the memory array 405 to the multiplexer 410 may be transmitted over a relatively wide data bus with a relatively low speed. Accordingly, the multiplexers 410 may serialize the data and ensure that one MSB data bit is outputted to the logic circuitry 415 and a corresponding LSB data bit is outputted to the logic circuitry 415. In some examples, the multiplexers 410 may be coupled to a buffer. In such examples, the buffer may temporarily store the data and output the data to the logic circuitry 415 based on receiving a signal or new data.

Logic circuitry 415 may be configured to receive the first data signal 460 (e.g., first input bit) and second data signal 465 (e.g., second input bit) from the multiplexers 410. In some examples, the logic circuitry 415 may be configured to convert the first data signal 460 and second data signal 465 associated with a binary code into a corresponding thermometer code (e.g., thermometer code as described with reference to FIG. 3). In some examples, the thermometer code may control which drivers are activated—e.g., the logic circuitry 415 may identify a logic state to drive and generate a thermometer code based at least in part on identifying the logic state. In some examples, the logic circuitry 415 may include a first plurality of gates configured to generate the different thermometer codes. In such examples, the logic circuitry 415 may also include a second plurality of gates that are complements of the first plurality of gates—e.g., the first plurality of gates may be configured to generate a true value of the thermometer code (e.g., for operating the pull-up drivers 425-a, 425-b, 425-c), and the second plurality of gates may be configured to generate complementary (e.g., inverted) value (e.g., for operating the pull-down drivers 430-a, 430-b, 430-c). The logic circuitry 415 may output control signals to the pre-drivers 420, each of which may indicate whether a driver 425 or 430 corresponding to the pre-driver 420 is to be activated. In some cases, a state of control signal output to a pre-driver 420 may be based on a logic value of a respective bit of a thermometer code, the respective bit corresponding to the driver 425 or 430 corresponding to the pre-driver 420. In some cases, the states of control signals output to the pre-drivers 420-d and 420-e may be based on a logic value of a respective bit of the binary code—e.g., the pull-down drivers 430-a and 430-b may be operated based on the binary code as described with reference to FIG. 3, and the pull-down driver 430-c may not be present.

Pre-drivers 420 may each be configured to amplify a control signal received from the logic circuitry 415 and transmit the amplified signal to a respective one of the drivers 425-a, 430-a, 425-b, 430-b, 425-c, 430-c. In some examples, the pre-drivers 420 may also receive or otherwise be configured with a strength code (e.g., a strength code determined during a calibration process as described elsewhere herein, such as with reference to FIG. 5 as one example) and transmit the strength code to the drivers 425, 430, which may control how many driver elements (e.g., driver elements 260) are activated within an activated driver 425, 430.

Drivers 425-a, 425-b, 425-c, 430-a, 430-b, and 430-c may be collectively configured to drive a signal line 455 to a voltage of one or more voltages based at least in part on receiving respective signals from the pre-drivers 420.

In some cases, the logic circuitry 415 may generate a first thermometer code (e.g., 000) associated with a first binary code received from the memory array 405 (e.g., 00). In such examples, the logic circuitry 415 may output control signals to the pre-drivers 420 such that the pre-drivers activate all three pull-down drivers 430 and deactivate all three pull-up drivers 425. For example, the pre-driver 420-a may deactivate driver 425-a, the pre-driver 420-b may deactivate driver 425-b, and the pre-driver 420-c may deactivate driver 425-c. Concurrently, the pre-driver 420-d may activate driver 430-a, the pre-driver 420-e may activate driver 430-b, and the pre-driver 420-f may activate driver 430-c. Accordingly, the drivers 430-a, 430-b, and 430-c may drive the signal line 455 to the first voltage.

In some cases, the logic circuitry 415 may generate a second thermometer code (e.g., 001) associated with a first binary code received from the memory array 405 (e.g., 01). In such examples, the logic circuitry 415 may output control signals to the pre-drivers 420 such that the pre-drivers activate two pull-down drivers 430 along with one pull-up driver 425 and deactivate one pull-down driver 430 along with two pull-up drivers 425. For example, the pre-driver 420-a may activate driver 425-a, the pre-driver 420-b may deactivate driver 425-b, and the pre-driver 420-c may deactivate driver 425-c. Concurrently, the pre-driver 420-d may activate driver 430-a, the pre-driver 420-e may activate driver 430-b, and the pre-driver 420-f may deactivate driver 430-c. Accordingly, the drivers 430-a, 430-b, and 425-a may drive the signal line 455 to the second voltage.

In some cases, the logic circuitry 415 may generate a third thermometer code (e.g., 011) associated with a first binary code received from the memory array 405 (e.g., 10). In such examples, the logic circuitry 415 may output control signals to the pre-drivers 420 such that the pre-drivers activate one pull-down driver 430 along with two pull-up drivers 425 and deactivate two pull-down drivers 430 along with one pull-up driver 425. For example, the pre-driver 420-*a* may activate driver 425-*a*, the pre-driver 420-*b* may activate driver 425-*b*, and the pre-driver 420-*c* may deactivate driver 425-*c*. Concurrently, the pre-driver 420-*d* may activate driver 430-*a*, the pre-driver 420-*e* may deactivate driver 430-*b*, and the pre-driver 420-*f* may deactivate driver 430-*c*. Accordingly, the drivers 430-*a*, 430-*b*, and 425-*a* may drive the signal line 455 to the third voltage.

In some cases, the logic circuitry 415 may generate a fourth thermometer code (e.g., 111) associated with a first binary code received from the memory array 405 (e.g., 11). In such examples, the logic circuitry 415 may output control signals to the pre-drivers 420 such that the pre-drivers deactivate all three pull-down drivers 430 and activate all three pull-up drivers 425. For example, the pre-driver 420-*a* may activate driver 425-*a*, the pre-driver 420-*b* may activate driver 425-*b*, and the pre-driver 420-*c* may activate driver 425-*c*. Concurrently, the pre-driver 420-*d* may deactivate driver 430-*a*, the pre-driver 420-*e* may deactivate driver 430-*b*, and the pre-driver 420-*f* may deactivate driver 430-*c*. Accordingly, the drivers 430-*a*, 430-*b*, and 430-*c* may drive the signal line 455 to the fourth voltage.

Figure 5:
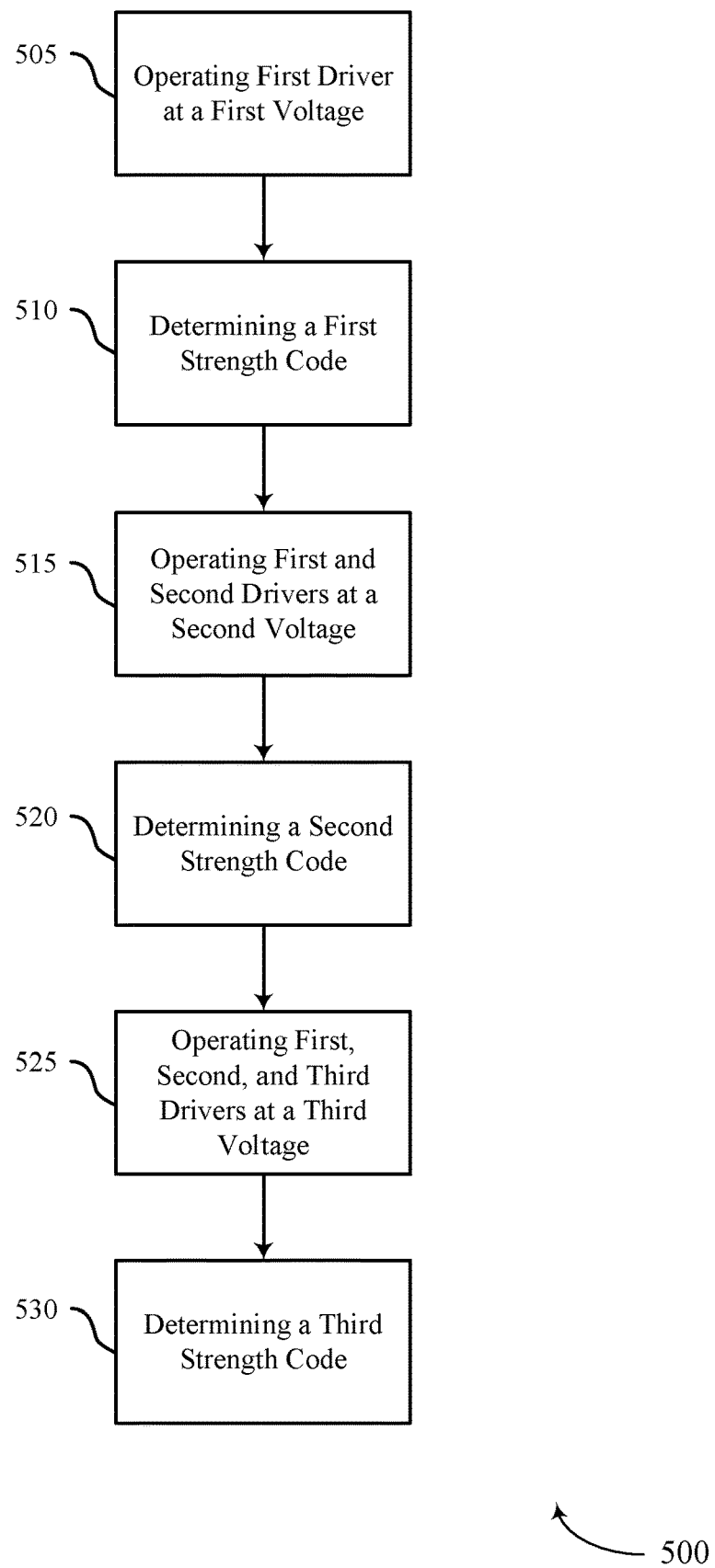
FIG. 5 illustrates an example of a flow diagram that supports thermometer coding for driving non-binary signals in accordance with examples as disclosed herein.

FIG. 5 illustrates an example of a flow diagram 500 that supports thermometer coding for driving non-binary signals in accordance with examples as disclosed herein. The operations of flow diagram 500 may be implemented by a device or its components as described herein. For example, flow diagram 500 may be performed by or on a system or circuit as described with reference to FIGS. 1-4. For example, flow diagram 500 may illustrate a calibration process for a set of pull-up drivers (e.g., set of pull-up drivers 215 or 315 as described with reference to FIG. 2 or 3). Although shown in a particular sequence or order, unless otherwise specified, the order of the processes may be modified. Thus, the illustrated examples are used as examples, and the illustrated processes may be performed in a different order, and some processes may be performed in parallel.

At 505, a first driver (e.g., a first pull-up driver 215-*a* as described with reference to FIG. 2) is operated (e.g., calibrated) at a first voltage (e.g., voltage 230-*b* as described with reference to FIG. 3). In some examples, to calibrate the first driver, the first driver may be coupled in series with a reference impedance—e.g., an external resistor. The first driver may also be coupled to a voltage source and as a result of being coupled in series with the reference impedance, the first driver and reference impedance may be configured as a voltage divider. In some examples, an output voltage of the voltage divider may be received at a comparator.

At 510, a first strength code for the first driver may be determined. In some cases, the comparator may also be coupled with a reference voltage. A strength code of the first driver may be adjusted until the output voltage matches the reference voltage and the comparator generates a signal indicating the output voltage is equal to the reference voltage. That is, the strength code at which the comparator generates the signal may be determined to be the first strength code. In some examples, adjusting the strength code may of the first driver may include activating or deactivating individual driver elements (e.g., driver elements 260) of the first driver. For example, the first driver may have a plurality of driver elements coupled with each other in parallel. Each driver element may comprise one or more transistors, one or more resistive components, or any combination thereof. Adjusting the strength code may activate a different quantity of driver elements within the driver and result in an adjustment of the overall strength (e.g., impedance) of the driver. In some examples, calibrating the first driver at the first voltage may cause the first driver to have a first calibrated impedance at the first voltage.

At 515, a second driver (e.g., a second pull-up driver 215-*b* as described with reference to FIG. 2) may be operated (e.g., calibrated) at a second voltage (e.g., voltage 230-*c*). In some examples, calibrating the second driver may include coupling the first driver and the second driver in parallel and concurrently activating the first driver and the second driver. In some examples, the first driver and second driver (e.g., the parallel combination thereof) may be coupled to a second reference impedance in series. The first driver and second driver may also be coupled with the comparator.

At 520, a second strength code for the second driver may be determined. In some cases, the comparator may also be coupled with a second reference voltage. A strength code of the second driver may be adjusted until the collective second output voltage of the first and second drivers matches the reference voltage and the comparator generates a second signal indicating the second output voltage is equal to the second reference voltage. That is, the strength code at which the comparator generates the second signal may be determined to be the second strength code. In some examples, calibrating the second driver at the second voltage may cause the second driver to a have a second calibrated impedance at the second voltage. The second calibrated impedance may be higher than the first calibrated impedance. The second strength code may be less than (e.g., correspond to smaller quantity of activated driver elements than) the first strength code.

At 525, a third driver (e.g., third pull-up driver 215-*c* as described with reference to FIG. 2) may be operated (e.g., calibrated) at a third voltage (e.g., voltage 230-*d*). In some examples, calibrating the third driver may include coupling the first driver, the second driver, and the third driver in parallel and concurrently activating the first driver, the second driver, and the third driver. In some examples, the first driver, the second driver, and the third driver (e.g., the parallel combination thereof) may be coupled to a third reference impedance in series. The first driver, second driver, and third driver may also be coupled with the comparator.

At 530, a third strength code for the third driver may be determined. In some cases, the comparator may also be coupled with a third reference voltage. A strength code of the third driver may be adjusted until the collective third output voltage of the first, second, and third drivers matches the reference voltage and the comparator generates a third signal indicating the third output voltage is equal to the third reference voltage. That is, the strength code at which the comparator generates the third signal may be determined to be the third strength code. In some examples, calibrating the third driver at the second voltage may cause the second driver to a have a third calibrated impedance at the third voltage. The third calibrated impedance may be higher than the second calibrated impedance. The third strength code may be less than (e.g., correspond to smaller quantity of activated driver elements than) the second strength code.

In some examples, a difference between the first calibrated impedance and the second calibrated impedance may be different than a difference between the second calibrated impedance and the third calibrated impedance—e.g., the calibrated impedances of the drivers may vary (e.g., scale)

according to a non-linear sequence or rate. Additionally or alternatively, the third strength code may be less than the second strength code, which may be less than the first strength code, and a difference between the first strength code and the second strength code may be different than a difference between the second strength code and the third strength code—e.g., the strength codes may also vary (e.g., scale) according to a non-linear sequence or rate.

By calibrating the first driver, the second driver, and third driver at different voltages, a collective impedance of the pull-up drivers may be effectively calibrated at each voltage level. Additionally or alternatively, utilizing strength codes that vary (e.g., scale) according to a non-linear sequence or rate may mitigate non-linearities specific to the individual drivers such that a driver that includes the first driver, the second driver, and third driver may more accurately and reliably drive a signal line to target voltages associated with a modulation scheme—e.g., a PAM4 modulation scheme.

Figure 6:
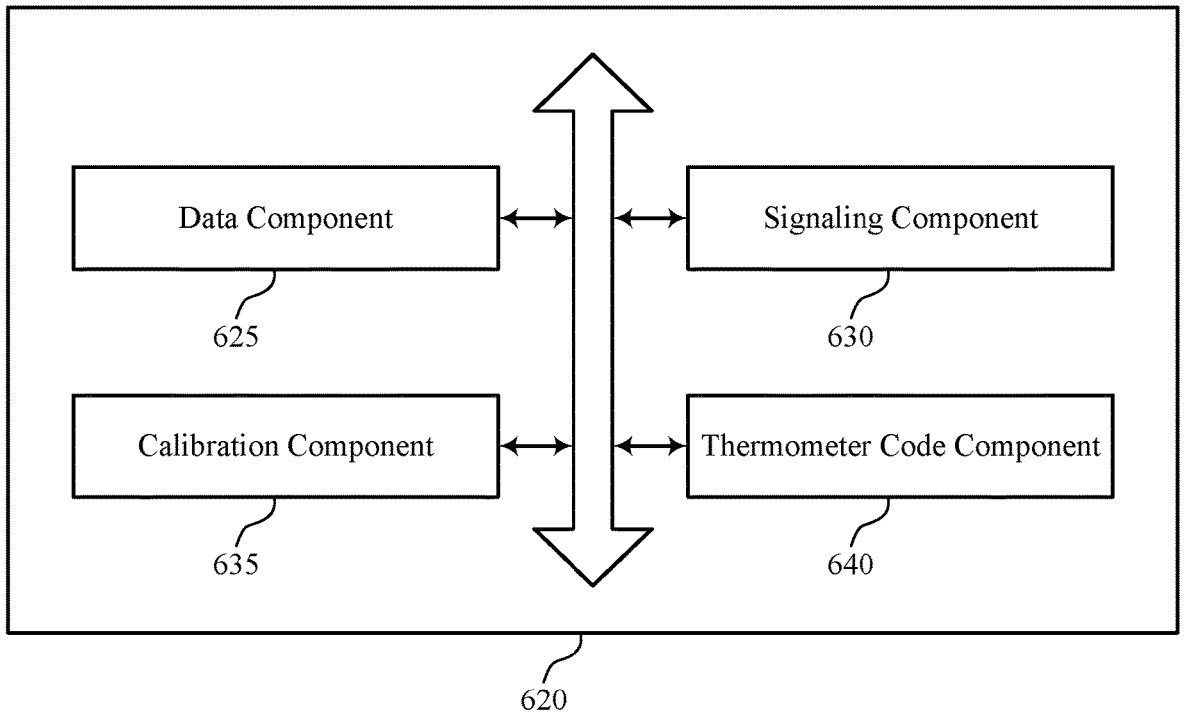
FIG. 6 shows a block diagram of a memory device that supports thermometer coding for driving non-binary signals in accordance with examples as disclosed herein.

FIG. 6 shows a block diagram 600 of a memory device 620 that supports thermometer coding for driving non-binary signals in accordance with examples as disclosed herein. The memory device 620 may be an example of aspects of a memory device as described with reference to FIGS. 1 through 5. The memory device 620, or various components thereof, may be an example of means for performing various aspects of thermometer coding for driving non-binary signals as described herein. For example, the memory device 620 may include a data component 625, a signaling component 630, a calibration component 635, a thermometer code component 640, or any combination thereof. Each of these components may communicate, directly or indirectly, with one another (e.g., via one or more buses).

The data component 625 may be configured as or otherwise support a means for identifying, based at least in part on first data stored within a memory array, a first logic value to indicate via a signal line. The signaling component 630 may be configured as or otherwise support a means for driving, based at least in part on the data component 625 identifying the first logic value, the signal line to a first voltage representative of the first logic value, where driving the signal line to the first voltage includes activating a first driver of a first type. As used herein, a driver of a first type may refer to a pull-up driver while a driver of a second type refers to a pull-down driver, or a driver of a first type may refer to a pull-down driver while a driver of a second type refers to a pull-up driver).

In some cases, the data component 625 may be configured as or otherwise support a means for identifying, based at least in part on second data stored within the memory array, a second logic value to indicate via the signal line. In some instances, the signaling component 630 may be configured as or otherwise support a means for driving, based at least in part on the data component 625 identifying the second logic value, the signal line to a second voltage representative of the second logic value, where driving the signal line to the second voltage includes activating the first driver of the first type and a second driver of the first type.

In some examples, the data component 625 may be configured as or otherwise support a means for identifying, based at least in part on third data stored within the memory array, a third logic value to indicate via the signal line. In some examples, the signaling component 630 may be configured as or otherwise support a means for driving, based at least in part on the data component 625 identifying the third logic value, the signal line to a third voltage representative of the third logic value, where driving the signal line to the third voltage includes activating the first driver of the first type, the second driver of the first type, and a third driver of the first type.

In some cases, to drive the signal line to the first voltage, the signaling component 630 may be configured to activate the first driver of the first type while the second driver of the first type and the third driver of the first type are deactivated. In some examples, to drive the signal line to the second voltage the signaling component 630 may be configured to activate the first driver of the first type and the second driver of the first type while the third driver of the first type is deactivated.

In some instances, to drive the signal line to the first voltage, the signaling component 630 may be configured to activate a first driver of a second type and the first driver of the first type while a second driver of the second type, the second driver of the first type, and the third driver of the first type are deactivated. In some examples, to drive the signal line to the second voltage, the signaling component 630 may be configured to activate the second driver of the second type, the first driver of the first type, and the second driver of the first type while the first driver of the second type and the third driver of the first type are deactivated. In some examples, to drive the signal line to the third voltage, the signaling component 630 may be configured to activate the first driver of the first type, the second driver of the first type, and the third driver of the first type while the first driver of the second type and the second driver of the second type are deactivated.

In some instances, the data component 625 may be configured as or otherwise support a means for identifying, based at least in part on fourth data stored within the memory array, a fourth logic value to indicate via the signal line. In some examples, the signaling component 630 may be configured as or otherwise support a means for driving, based at least in part on the data component 625 identifying the fourth logic value, the signal line to a fourth voltage representative of the fourth logic value, where driving the signal line to the fourth voltage includes activating the first driver of the second type and the second driver of the second type while the first driver of the first type, the second driver of the first type, and the third driver of the first type are deactivated.

In some instances, the thermometer code component 640 may be configured as or otherwise support a means for generating a first thermometer code based at least in part on a first binary code corresponding to the first logic value, where activating the first driver of the first type is based at least in part on the first thermometer code. In some cases, the thermometer code component 640 may be configured as or otherwise support a means for generating a second thermometer code based at least in part on a second binary code corresponding to the second logic value, where activating the first driver of the first type and the second driver of the first type is based at least in part on the second thermometer code. In some instances, the thermometer code component 640 may be configured as or otherwise support a means for generating a third thermometer code based at least in part on a third binary code corresponding to the third logic value, where activating the first driver of the first type, the second driver of the first type, and the third driver of the first type is based at least in part on the third thermometer code.

In some cases, the signaling component 630 may be configured as or otherwise support a means for activating a first driver of the second type while a second driver of the second type is deactivated based at least in part on the first binary code. In some examples, the signaling component

630 may be configured as or otherwise support a means for activating the second driver of the second type while the first driver of the second type is deactivated based at least in part on the second binary code. In some examples, the signaling component 630 may be configured as or otherwise support a means for refraining from activating the first driver of the second type and the second driver of the second type based at least in part on the third binary code.

In some instances, the first driver of the first type may be configured to have a first output impedance when activated. In some examples, the second driver of the first type may be configured to have a second output impedance when activated, the second output impedance different than the first output impedance by a first amount. In some examples, the third driver of the first type may be configured to have a third output impedance when activated, the third output impedance different than the second output impedance by a second amount.

In some examples, the first voltage, the second voltage, and the third voltage signaled by the signaling component 630 are included in a set of three or more voltage levels associated with a pulse-amplitude modulation (PAM) scheme.

The calibration component 635 may be configured as or otherwise support a means for operating a first driver of the first type at a first voltage to determine a first strength code for driving a signal line using the first driver of the first type. In some examples, the calibration component 635 may be configured as or otherwise support a means for operating a second driver of the first type at a second voltage while coupled in parallel with the first driver of the first type to determine a second strength code for driving the signal line using the second driver of the first type. In some examples, the calibration component 635 may be configured as or otherwise support a means for operating a third driver of the first type at a third voltage while coupled in parallel with the first driver of the first type and the second driver of the first type to determine a third strength code for driving the signal line using the third driver of the first type.

In some examples, a first difference between the first strength code and the second strength code determined by the calibration component 635 is different than a second difference between the second strength code and the third strength code determined by the calibration component 635.

In some examples, the signaling component 630 may be configured as or otherwise support a means for driving the signal line to the first voltage using the first driver of the first type while the second driver of the first type and the third driver of the first type are deactivated. In some cases, the signaling component 630 may be configured as or otherwise support a means for driving the signal line to the second voltage using the first driver of the first type and the second driver of the first type while the third driver of the first type is deactivated. In some examples, the signaling component 630 may be configured as or otherwise support a means for driving the signal line to the third voltage using the first driver of the first type, the second driver of the first type, and the third driver of the first type.

Figure 7:
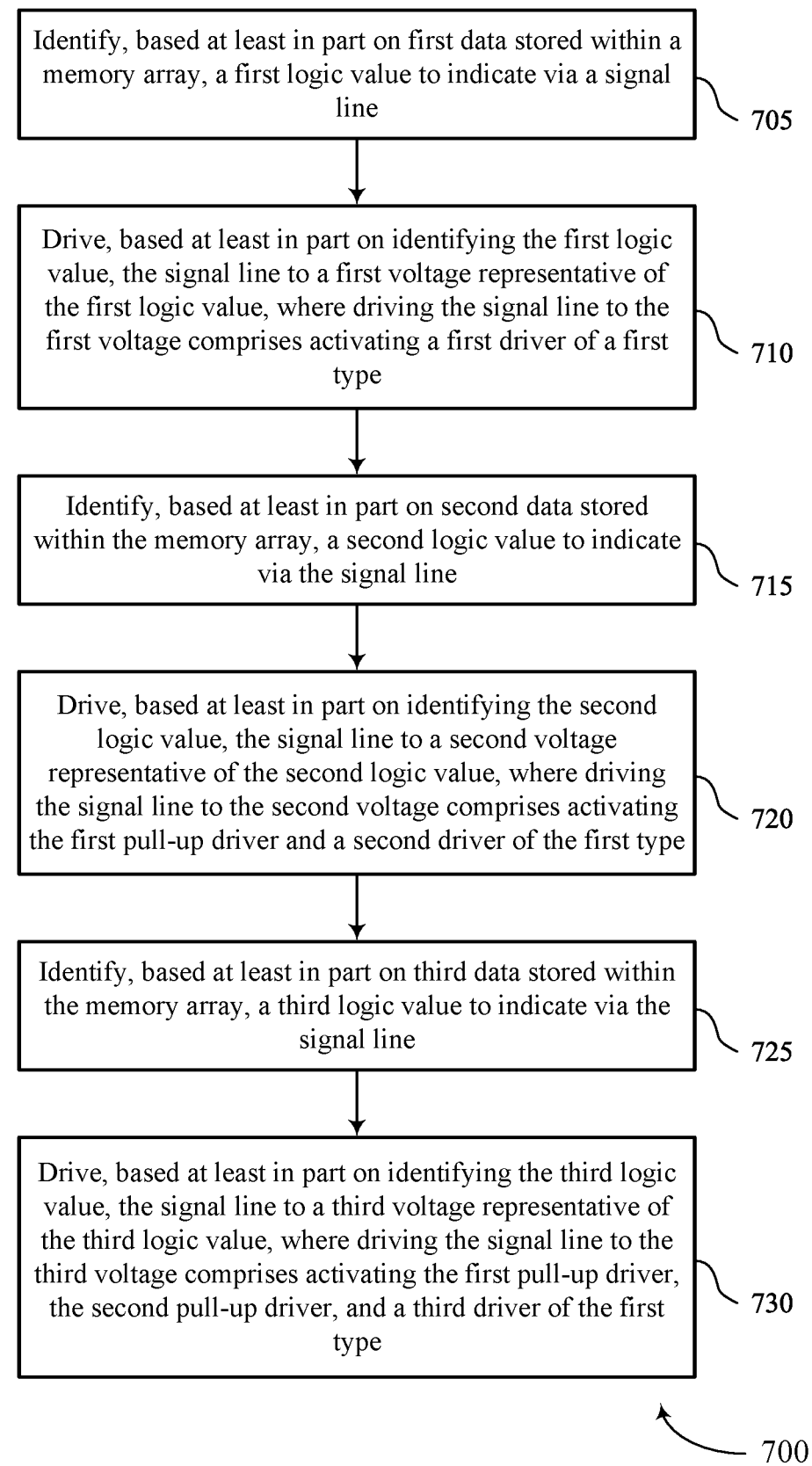
FIGS. 7 and 8 show flowcharts illustrating a method or methods that support thermometer coding for driving non-binary signals in accordance with examples as disclosed herein.

FIG. 7 shows a flowchart illustrating a method 700 that supports thermometer coding for driving non-binary signals in accordance with examples as disclosed herein. The operations of method 700 may be implemented by a memory device or its components as described herein. For example, the operations of method 700 may be performed by a memory device as described with reference to FIGS. 1 through 6. In some examples, a memory device may execute a set of instructions to control the functional elements of the device to perform the described functions. Additionally or alternatively, the memory device may perform aspects of the described functions using special-purpose hardware.

At 705, the method may include identifying, based at least in part on first data stored within a memory array, a first logic value to indicate via a signal line. The operations of 705 may be performed in accordance with examples as disclosed herein. In some examples, aspects of the operations of 705 may be performed by a data component 625 as described with reference to FIG. 6.

At 710, the method may include driving, based at least in part on identifying the first logic value, the signal line to a first voltage representative of the first logic value, where driving the signal line to the first voltage includes activating a first driver of a first type. The operations of 710 may be performed in accordance with examples as disclosed herein. In some examples, aspects of the operations of 710 may be performed by a signaling component 630 as described with reference to FIG. 6.

At 715, the method may include identifying, based at least in part on second data stored within the memory array, a second logic value to indicate via the signal line. The operations of 715 may be performed in accordance with examples as disclosed herein. In some examples, aspects of the operations of 715 may be performed by a data component 625 as described with reference to FIG. 6.

At 720, the method may include driving, based at least in part on identifying the second logic value, the signal line to a second voltage representative of the second logic value, where driving the signal line to the second voltage includes activating the first driver of the first type and a second driver of the first type. The operations of 720 may be performed in accordance with examples as disclosed herein. In some examples, aspects of the operations of 720 may be performed by a signaling component 630 as described with reference to FIG. 6.

At 725, the method may include identifying, based at least in part on third data stored within the memory array, a third logic value to indicate via the signal line. The operations of 725 may be performed in accordance with examples as disclosed herein. In some examples, aspects of the operations of 725 may be performed by a data component 625 as described with reference to FIG. 6.

At 730, the method may include driving, based at least in part on identifying the third logic value, the signal line to a third voltage representative of the third logic value, where driving the signal line to the third voltage includes activating the first driver of the first type, the second driver of the first type, and a third driver of the first type. The operations of 730 may be performed in accordance with examples as disclosed herein. In some examples, aspects of the operations of 730 may be performed by a signaling component 630 as described with reference to FIG. 6.

In some instances, an apparatus as described herein may perform a method or methods, such as the method 700. The apparatus may include, features, circuitry, logic, means, or instructions (e.g., a non-transitory computer-readable medium storing instructions executable by a processor) for identifying, based at least in part on first data stored within a memory array, a first logic value to indicate via a signal line, and driving, based at least in part on identifying the first logic value, the signal line to a first voltage representative of the first logic value, where driving the signal line to the first voltage includes activating a first driver of a first type. The apparatus may further include, features, circuitry, logic, means, or instructions for identifying, based at least in part on second data stored within the memory array, a second logic value to indicate via the signal line, and driving, based at least in part on identifying the second logic value, the signal line to a second voltage representative of the second logic value, where driving the signal line to the second voltage includes activating the first driver of the first type and a second driver of the first type. The apparatus may also include, features, circuitry, logic, means, or instructions for identifying, based at least in part on third data stored within the memory array, a third logic value to indicate via the signal line, and driving, based at least in part on identifying the third logic value, the signal line to a third voltage representative of the third logic value, where driving the signal line to the third voltage includes activating the first driver of the first type, the second driver of the first type, and a third driver of the first type.

In some examples of the method 700 and the apparatus described herein, operations, features, circuitry, logic, means, or instructions for driving the signal line to the first voltage may include operations, features, circuitry, logic, means, or instructions for activating the first driver of the first type while the second driver of the first type and the third driver of the first type are deactivated, and operations, features, circuitry, logic, means, or instructions for driving the signal line to the second voltage may include operations, features, circuitry, logic, means, or instructions for activating the first driver of the first type and the second driver of the first type while the third driver of the first type is deactivated.

In some cases of the method 700 and the apparatus described herein, operations, features, circuitry, logic, means, or instructions for driving the signal line to the first voltage may include operations, features, circuitry, logic, means, or instructions for activating a first driver of a second type and the first driver of the first type while a second driver of the second type, the second driver of the first type, and the third driver of the first type are deactivated, operations, features, circuitry, logic, means, or instructions for driving the signal line to the second voltage may include operations, features, circuitry, logic, means, or instructions for activating the second driver of the second type, the first driver of the first type, and the second driver of the first type while the first driver of the second type and the third driver of the first type are deactivated, and operations, features, circuitry, logic, means, or instructions for driving the signal line to the third voltage may include operations, features, circuitry, logic, means, or instructions for activating the first driver of the first type, the second driver of the first type, and the third driver of the first type while the first driver of the second type and the second driver of the second type are deactivated.

Some instances of the method 700 and the apparatus described herein may further include operations, features, circuitry, logic, means, or instructions for identifying, based at least in part on fourth data stored within the memory array, a fourth logic value to indicate via the signal line, and driving, based at least in part on identifying the fourth logic value, the signal line to a fourth voltage representative of the fourth logic value, where driving the signal line to the fourth voltage includes activating the first driver of the second type and the second driver of the second type while the first driver of the first type, the second driver of the first type, and the third driver of the first type may be deactivated.

Some cases of the method 700 and the apparatus described herein may further include operations, features, circuitry, logic, means, or instructions for generating a first thermometer code based at least in part on a first binary code corresponding to the first logic value, where activating the first driver of the first type may be based at least in part on the first thermometer code, generating a second thermometer code based at least in part on a second binary code corresponding to the second logic value, where activating the first driver of the first type and the second driver of the first type may be based at least in part on the second thermometer code, and generating a third thermometer code based at least in part on a third binary code corresponding to the third logic value, where activating the first driver of the first type, the second driver of the first type, and the third driver of the first type may be based at least in part on the third thermometer code.

Some instances of the method 700 and the apparatus described herein may further include operations, features, circuitry, logic, means, or instructions for activating a first driver of the second type while a second driver of the second type is deactivated based at least in part on the first binary code, activating the second driver of the second type while the first driver of the second type is deactivated based at least in part on the second binary code, and refraining from activating the first driver of the second type and the second driver of the second type based at least in part on the third binary code.

In some examples of the method 700 and the apparatus described herein, the first voltage, the second voltage, and the third voltage may be included in a set of three or more voltage levels associated with a pulse-amplitude modulation (PAM) scheme.

In some instances of the method 700 and the apparatus described herein, the first driver of the first type may be configured to may have a first output impedance when activated, the second driver of the first type may be configured to may have a second output impedance when activated, the second output impedance different than the first output impedance by a first amount, and the third driver of the first type may be configured to may have a third output impedance when activated, the third output impedance different than the second output impedance by a second amount (e.g., different than the first amount).

Figure 8:
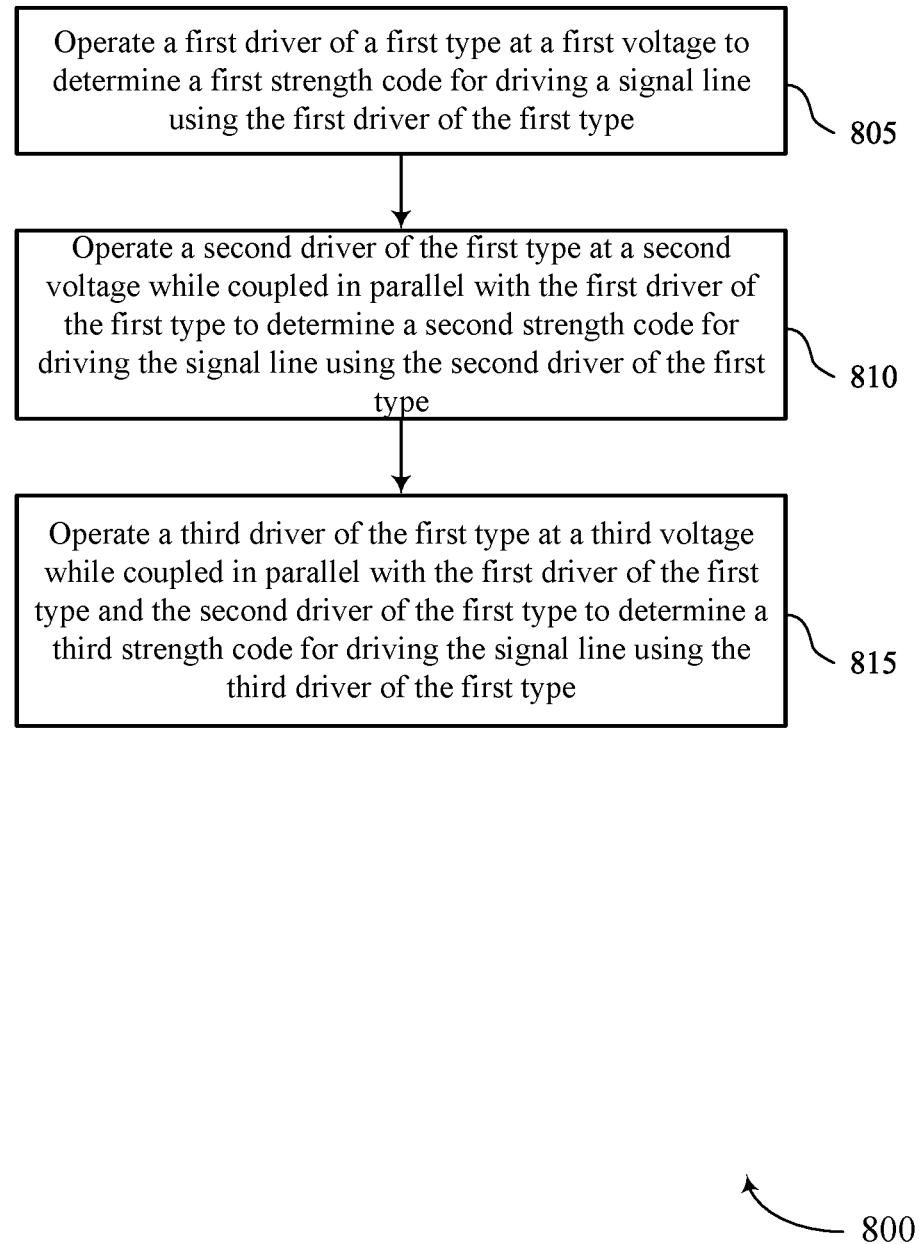

FIG. 8 shows a flowchart illustrating a method 800 that supports thermometer coding for driving non-binary signals in accordance with examples as disclosed herein. The operations of method 800 may be implemented by a memory device or its components as described herein. For example, the operations of method 800 may be performed by a memory device as described with reference to FIGS. 1 through 6. In some examples, a memory device may execute a set of instructions to control the functional elements of the device to perform the described functions. Additionally or alternatively, the memory device may perform aspects of the described functions using special-purpose hardware.

At 805, the method may include operating a first driver of a first type at a first voltage to determine a first strength code for driving a signal line using the first driver of the first type. The operations of 805 may be performed in accordance with examples as disclosed herein. In some examples, aspects of the operations of 805 may be performed by a calibration component 635 as described with reference to FIG. 6.

At 810, the method may include operating a second driver of the first type at a second voltage while coupled in parallel with the first driver of the first type to determine a second strength code for driving the signal line using the second driver of the first type. The operations of 810 may be performed in accordance with examples as disclosed herein. In some examples, aspects of the operations of 810 may be performed by a calibration component 635 as described with reference to FIG. 6.

At 815, the method may include operating a third driver of the first type at a third voltage while coupled in parallel with the first driver of the first type and the second driver of the first type to determine a third strength code for driving the signal line using the third driver of the first type. The operations of 815 may be performed in accordance with examples as disclosed herein. In some examples, aspects of the operations of 815 may be performed by a calibration component 635 as described with reference to FIG. 6.

In some cases, an apparatus as described herein may perform a method or methods, such as the method 800. The apparatus may include, features, circuitry, logic, means, or instructions (e.g., a non-transitory computer-readable medium storing instructions executable by a processor) for operating a first driver of the first type at a first voltage to determine a first strength code for driving a signal line using the first driver of the first type, operating a second driver of the first type at a second voltage while coupled in parallel with the first driver of the first type to determine a second strength code for driving the signal line using the second driver of the first type, and operating a third driver of the first type at a third voltage while coupled in parallel with the first driver of the first type and the second driver of the first type to determine a third strength code for driving the signal line using the third driver of the first type.

In some instances of the method 800 and the apparatus described herein, a first difference between the first strength code and the second strength code may be different than a second difference between the second strength code and the third strength code.

Some examples of the method 800 and the apparatus described herein may further include operations, features, circuitry, logic, means, or instructions for driving the signal line to the first voltage using the first driver of the first type while the second driver of the first type and the third driver of the first type are deactivated, driving the signal line to the second voltage using the first driver of the first type and the second driver of the first type while the third driver of the first type is deactivated, and driving the signal line to the third voltage using the first driver of the first type, the second driver of the first type, and the third driver of the first type.

It should be noted that the methods described herein describe possible implementations, and that the operations and the steps may be rearranged or otherwise modified and that other implementations are possible. Further, portions from two or more of the methods may be combined.

An apparatus is described. The apparatus may include a memory array configured to store data and a driver coupled with the memory array and a signal line. The driver may be configured to transmit signaling via the signal line that is associated with three or more voltages and is based at least in part on the data. The driver may include a first driver of a first type, a second driver of the first type, and a third driver of the first type, and the driver may be configured to drive the signal line to a first voltage of the three or more voltages based at least in part on activating the first driver of the first type, to drive the signal line to a second voltage of the three or more voltages based at least in part on activating the second driver of the first type concurrent with the first driver of the first type, and to drive the signal line to a third voltage of the three or more voltages based at least in part on activating the third driver of the first type concurrent with the first driver of the first type and the second driver of the first type.

In some instances of the apparatus, to drive the signal line to the first voltage, the driver may be configured to activate the first driver of the first type while the second driver of the first type and the third driver of the first type are deactivated, and to drive the signal line to the second voltage, the driver may be configured to activate the first driver of the first type and the second driver of the first type while the third driver of the first type is deactivated.

In some examples, to drive the signal line to the first voltage, the driver may be configured to activate a first driver of a second type while a second driver of the second type is deactivated, and to drive the signal line to the second voltage, the driver may be configured to activate the second driver of the second type while the first driver of the second type is deactivated, and to drive the signal line to the third voltage, the driver may be configured to activate the first driver of the first type, the second driver of the first type, and the third driver of the first type while the first driver of the second type and the second driver of the second type are deactivated.

In some examples of the apparatus, to drive the signal line to a fourth voltage of the three or more voltages, the driver may be configured to activate the first driver of the second type and the second driver of the second type while the first driver of the first type, the second driver of the first type, and the third driver of the first type are deactivated.

In some cases, the apparatus may further include logic circuitry coupled with the driver. The logic circuitry may be configured to receive a first input bit and a second input bit and generate, based at least in part on the first input bit and the second input bit, a first output signal that indicates whether the first driver of the first type is to be activated, a second output signal that indicates whether the second driver of the first type is to be activated, and a third output signal that indicates whether the third driver of the first type is to be activated.

In some instances of the apparatus, the driver further includes a set of drivers of a second type configured to be operated based at least in part on a binary code including a most significant bit and a least significant bit, where the first driver of the first type, the second driver of the first type, and the third driver of the first type may be configured to be operated based at least in part on a thermometer code corresponding to the binary code.

In some examples of the apparatus, the first driver of the first type may be configured to may have a first output impedance when activated, the second driver of the first type may be configured to may have a second output impedance when activated, and the third driver of the first type may be configured to may have a third output impedance when activated.

In some cases of the apparatus, a first difference between the first output impedance and the second output impedance may be different than a second difference between from the second output impedance and the third output impedance.

In some instances of the apparatus, the first output impedance may be less than the second output impedance and the second output impedance may be less than the third output impedance.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a memory array configured to store data; and
a driver coupled with the memory array and a signal line, the driver comprising a first driver of a first type, a second driver of the first type, and a third driver of the first type, wherein the driver is configured to transmit signaling via the signal line that is associated with three or more voltages and is based at least in part on the data, and wherein the driver is further configured to:
drive the signal line to a first voltage of the three or more voltages based at least in part on activating the first driver of the first type;
drive the signal line to a second voltage of the three or more voltages based at least in part on activating the second driver of the first type concurrent with the first driver of the first type; and
drive the signal line to a third voltage of the three or more voltages based at least in part on activating the third driver of the first type concurrent with the first driver of the first type and the second driver of the first type.

2. The apparatus of claim 1, wherein:
to drive the signal line to the first voltage, the driver is configured to activate the first driver of the first type while the second driver of the first type and the third driver of the first type are deactivated; and
to drive the signal line to the second voltage, the driver is configured to activate the first driver of the first type and the second driver of the first type while the third driver of the first type is deactivated.

3. The apparatus of claim 2, wherein:
to drive the signal line to the first voltage, the driver is configured to activate a first driver of a second type while a second driver of the second type is deactivated;
to drive the signal line to the second voltage, the driver is configured to activate the second driver of the second type while the first driver of the second type is deactivated; and
to drive the signal line to the third voltage, the driver is configured to activate the first driver of the first type, the second driver of the first type, and the third driver of the first type while the first driver of the second type and the second driver of the second type are deactivated.

4. The apparatus of claim 3, wherein:
to drive the signal line to a fourth voltage of the three or more voltages, the driver is configured to activate the first driver of the second type and the second driver of the second type while the first driver of the first type, the second driver of the first type, and the third driver of the first type are deactivated.

5. The apparatus of claim 1, further comprising logic circuitry coupled with the driver and configured to:
receive a first input bit and a second input bit; and
generate, based at least in part on the first input bit and the second input bit, a first output signal that indicates whether the first driver of the first type is to be activated, a second output signal that indicates whether the second driver of the first type is to be activated, and a third output signal that indicates whether the third driver of the first type is to be activated.

6. The apparatus of claim 1, wherein the driver further comprises:
a set of drivers of a second type configured to be operated based at least in part on a binary code comprising a most significant bit and a least significant bit, wherein the first driver of the first type, the second driver of the first type, and the third driver of the first type are configured to be operated based at least in part on a thermometer code corresponding to the binary code.

7. The apparatus of claim 1, wherein:
the first driver of the first type is configured to have a first output impedance when activated;
the second driver of the first type is configured to have a second output impedance when activated; and
the third driver of the first type is configured to have a third output impedance when activated.

8. The apparatus of claim 7, wherein a first difference between the first output impedance and the second output impedance is different than a second difference between from the second output impedance and the third output impedance.

9. The apparatus of claim 7, wherein:
the first output impedance is less than the second output impedance; and
the second output impedance is less than the third output impedance.

10. A method, comprising:
identifying, based at least in part on first data stored within a memory array, a first logic value to indicate via a signal line;
driving, based at least in part on identifying the first logic value, the signal line to a first voltage representative of the first logic value, wherein driving the signal line to the first voltage comprises activating a first driver of a first type;
identifying, based at least in part on second data stored within the memory array, a second logic value to indicate via the signal line;
driving, based at least in part on identifying the second logic value, the signal line to a second voltage representative of the second logic value, wherein driving the signal line to the second voltage comprises activating the first driver of the first type and a second driver of the first type;
identifying, based at least in part on third data stored within the memory array, a third logic value to indicate via the signal line; and
driving, based at least in part on identifying the third logic value, the signal line to a third voltage representative of the third logic value, wherein driving the signal line to the third voltage comprises activating the first driver of the first type, the second driver of the first type, and a third driver of the first type.

11. The method of claim 10, wherein:
driving the signal line to the first voltage comprises activating the first driver of the first type while the second driver of the first type and the third driver of the first type are deactivated; and
driving the signal line to the second voltage comprises activating the first driver of the first type and the second driver of the first type while the third driver of the first type is deactivated.

12. The method of claim 11, wherein:
driving the signal line to the first voltage comprises activating a first driver of a second type and the first driver of the first type while a second driver of the second type, the second driver of the first type, and the third driver of the first type are deactivated;
driving the signal line to the second voltage comprises activating the second driver of the second type, the first driver of the first type, and the second driver of the first type while the first driver of the second type and the third driver of the first type are deactivated; and
driving the signal line to the third voltage comprises activating the first driver of the first type, the second driver of the first type, and the third driver of the first type while the first driver of the second type and the second driver of the second type are deactivated.

13. The method of claim 12, further comprising:
identifying, based at least in part on fourth data stored within the memory array, a fourth logic value to indicate via the signal line; and
driving, based at least in part on identifying the fourth logic value, the signal line to a fourth voltage representative of the fourth logic value, wherein driving the signal line to the fourth voltage comprises activating the first driver of the second type and the second driver of the second type while the first driver of the first type, the second driver of the first type, and the third driver of the first type are deactivated.

14. The method of claim 11, further comprising:
generating a first thermometer code based at least in part on a first binary code corresponding to the first logic value, wherein activating the first driver of the first type is based at least in part on the first thermometer code;
generating a second thermometer code based at least in part on a second binary code corresponding to the second logic value, wherein activating the first driver of the first type and the second driver of the first type is based at least in part on the second thermometer code; and
generating a third thermometer code based at least in part on a third binary code corresponding to the third logic value, wherein activating the first driver of the first type, the second driver of the first type, and the third driver of the first type is based at least in part on the third thermometer code.

15. The method of claim 14, further comprising:
activating a first driver of a second type while a second driver of the second type is deactivated based at least in part on the first binary code;
activating the second driver of the second type while the first driver of the second type is deactivated based at least in part on the second binary code; and
refraining from activating the first driver of the second type and the second driver of the second type based at least in part on the third binary code.

16. The method of claim 10, wherein:
the first driver of the first type is configured to have a first output impedance when activated;
the second driver of the first type is configured to have a second output impedance when activated, the second output impedance different than the first output impedance by a first amount; and
the third driver of the first type is configured to have a third output impedance when activated, the third output impedance different than the second output impedance by a second amount.

17. The method of claim 10, wherein the first voltage, the second voltage, and the third voltage are included in a set of three or more voltage levels associated with a pulse-amplitude modulation (PAM) scheme.

18. A method, comprising:
operating a first driver of a first type at a first voltage to determine a first strength code for driving a signal line using the first driver of the first type;
operating a second driver of the first type at a second voltage while coupled in parallel with the first driver of the first type to determine a second strength code for driving the signal line using the second driver of the first type; and
operating a third driver of the first type at a third voltage while coupled in parallel with the first driver of the first type and the second driver of the first type to determine a third strength code for driving the signal line using the third driver of the first type.

19. The method of claim 18, wherein a first difference between the first strength code and the second strength code is different than a second difference between the second strength code and the third strength code.

20. The method of claim 18, further comprising:
driving the signal line to the first voltage using the first driver of the first type while the second driver of the first type and the third driver of the first type are deactivated;

driving the signal line to the second voltage using the first driver of the first type and the second driver of the first type while the third driver of the first type is deactivated; and driving the signal line to the third voltage using the first driver of the first type, the second driver of the first type, and the third driver of the first type.

* * * * *